(12) United States Patent
Dozier, II et al.

(10) Patent No.: US 8,513,969 B2
(45) Date of Patent: Aug. 20, 2013

(54) APPARATUS AND METHOD OF TESTING SINGULATED DIES

(75) Inventors: Thomas H. Dozier, II, Livermore, CA (US); Benjamin N. Eldridge, Danville, CA (US); David H. Hsu, San Jose, CA (US); Igor Y. Khandros, Orinda, CA (US); Charles A. Miller, Fremont, CA (US)

(73) Assignee: FormFactor, Inc., Livermore, CA (US)

( * ) Notice: Subject to any disclaimer, the term of this patent is extended or adjusted under 35 U.S.C. 154(b) by 0 days.

(21) Appl. No.: 12/796,457

(22) Filed: Jun. 8, 2010

(65) Prior Publication Data

US 2010/0244873 A1    Sep. 30, 2010

Related U.S. Application Data

(62) Division of application No. 11/532,494, filed on Sep. 15, 2006, now Pat. No. 7,733,106.

(60) Provisional application No. 60/718,820, filed on Sep. 19, 2005.

(51) Int. Cl.
*G01R 31/20* (2006.01)

(52) U.S. Cl.
USPC ............ 324/754.09; 324/756.02; 324/754.01; 324/755.01; 324/756.01

(58) Field of Classification Search
USPC ............. 324/754–765, 158.1, 754.09, 754.01
See application file for complete search history.

(56) References Cited

U.S. PATENT DOCUMENTS

| | | | |
|---|---|---|---|
| 4,617,586 A | | 10/1986 | Cuvilliers et al. |
| 4,987,477 A | * | 1/1991 | Ikeno ............................ 257/724 |
| 5,180,974 A | | 1/1993 | Mitchell et al. |
| 5,237,268 A | | 8/1993 | Honma et al. |
| 5,367,253 A | | 11/1994 | Wood et al. |
| 5,396,185 A | * | 3/1995 | Honma et al. ........... 324/754.08 |
| 5,408,190 A | * | 4/1995 | Wood et al. .............. 324/750.19 |
| 5,440,241 A | | 8/1995 | King et al. |
| 5,517,125 A | * | 5/1996 | Posedel et al. ................ 324/755 |
| 5,621,333 A | | 4/1997 | Long et al. |
| 5,634,267 A | | 6/1997 | Farnworth et al. |
| 5,644,247 A | * | 7/1997 | Hyun et al. .............. 324/750.05 |
| 5,682,064 A | | 10/1997 | Atkins et al. |
| 5,825,171 A | * | 10/1998 | Shin ............................ 324/73.1 |
| 5,952,840 A | | 9/1999 | Farnworth et al. |
| 6,002,266 A | | 12/1999 | Briggs et al. |
| 6,094,056 A | * | 7/2000 | Bardsley et al. ......... 324/756.01 |

(Continued)

FOREIGN PATENT DOCUMENTS

| | | |
|---|---|---|
| JP | 05-013603 | 1/1993 |
| JP | 2000-100882 | 4/2000 |

OTHER PUBLICATIONS

International Preliminary Report on Patentability, PCT/US2006/036336, Mar. 26, 2009, 10 pages.

*Primary Examiner* — Richard Isla Rodas
(74) *Attorney, Agent, or Firm* — Kirton McConkie

(57) ABSTRACT

An exemplary die carrier is disclosed. In some embodiments, the die carrier can hold a plurality of singulated dies while the dies are tested. The dies can be arranged on the carrier in a pattern that facilities testing the dies. The carrier can be configured to allow interchangeable interfaces to different testers to be attached to and detached from the carrier. The carrier can also be configured as a shipping container for the dies.

19 Claims, 22 Drawing Sheets

(56) References Cited

U.S. PATENT DOCUMENTS

| | | | |
|---|---|---|---|
| 6,118,286 | A | 9/2000 | Fredrickson |
| 6,124,725 | A | 9/2000 | Sato |
| 6,181,146 | B1 * | 1/2001 | Koyama ................. 324/750.05 |
| 6,275,051 | B1 | 8/2001 | Bachelder et al. |
| 6,313,522 | B1 | 11/2001 | Akram et al. |
| 6,434,503 | B1 | 8/2002 | Sommer |
| 6,452,807 | B1 * | 9/2002 | Barrett ......................... 361/767 |
| 6,529,022 | B2 | 3/2003 | Pierce |
| 6,555,400 | B2 * | 4/2003 | Farnworth et al. ............... 438/17 |
| 6,577,003 | B1 | 6/2003 | Crane, Jr. et al. |
| 6,593,168 | B1 * | 7/2003 | Ehrichs et al. ................ 438/108 |
| 6,750,672 | B2 * | 6/2004 | Tanimura et al. ......... 324/754.09 |
| 6,777,971 | B2 | 8/2004 | Kirloskar et al. |
| 6,851,096 | B2 | 2/2005 | Alexander |
| 6,853,209 | B1 | 2/2005 | Jovanovic et al. |
| 6,927,083 | B2 | 8/2005 | Kline |
| 6,930,499 | B2 | 8/2005 | Van Arendonk et al. |
| 7,046,022 | B2 | 5/2006 | Richmond et al. |
| 7,247,035 | B2 | 7/2007 | Mok et al. |
| 7,595,631 | B2 * | 9/2009 | Lu et al. ..................... 324/158.1 |
| 7,733,106 | B2 | 6/2010 | Dozier, II et al. |
| 7,768,005 | B2 * | 8/2010 | Condorelli et al. ............. 257/48 |
| 2003/0206030 | A1 | 11/2003 | Wood et al. |
| 2004/0061207 | A1 | 4/2004 | Ding |
| 2004/0189333 | A1 * | 9/2004 | Dobritz et al. ................. 324/754 |
| 2004/0212389 | A1 * | 10/2004 | Hamren et al. ................. 324/765 |
| 2005/0024080 | A1 * | 2/2005 | Cobbley et al. ............... 324/765 |
| 2005/0161786 | A1 | 7/2005 | Zhuang |

* cited by examiner

APPARATUS AND METHOD OF TESTING SINGULATED DIES

CROSS REFERENCE TO RELATED APPLICATIONS

This application is a division of U.S. patent application Ser. No. 11/532,494, filed Sep. 15, 2006 (now U.S. Pat. No. 7,733, 106), which claims priority to U.S. Provisional Patent Application Ser. No. 60/718,820, filed Sep. 19, 2005. The foregoing U.S. patent application Ser. No. 11/532,494 and U.S. Provisional Patent Application Ser. No. 60/718,820 are incorporated herein by reference in their entirety.

BACKGROUND

Semiconductor devices are typically manufactured many at a time as "dies" on a semiconductor wafer, after which the dies are further processed before being shipped to customers or installed in various products. Semiconductor manufacturing is typically considered to have front end processing, which includes process steps completed at a wafer level and back end processing to handle single die. Thereafter, when the dies are singulated from the wafer, and the dies that passed the initial probe testing are packaged, burned in, and further tested. In another common process, the dies are not packaged after being singulated from the wafer but are further tested and often burned in to produce "known good dies," which are unpackaged dies that have been fully tested. In more advanced processes, the dies are burned in and fully tested while in wafer form.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein. Moreover, the Figures may show simplified or partial views, and the dimensions of elements in the Figures may be exaggerated or otherwise not in proportion for clarity. In addition, as the terms "on" and "attached to" are used herein, one object (e.g., a material, a layer, a substrate, etc.) can be "on" or "attached to" another object regardless of whether the one object is directly on or attached to the other object or there are one or more intervening objects between the one object and the other object. Also, directions (e.g., above, below, top, bottom, side, vertical, horizontal, "x," "y," "z," etc.), if provided, are relative and provided solely by way of example and for ease of illustration and discussion and not by way of limitation.

Although this invention is generally applicable to test systems and methods in general, it is particularly suited for semiconductor device testing.

Some embodiments of the invention address picking and placing die singulated from a wafer onto a testing substrate. The same testing substrate can be used for a variety of test phases such as high frequency testing, burn-in, and final test. The die can be placed in accordance with a predetermined arrangement that facilitates use in multiple test stations. The arrangement can be selected in accordance with metrics that tend to increase overall tester utilization among the plurality of testers.

Some embodiments of the invention address methodologies for placing the die in arrangements that enhance or facilitate certain types of testing. For example, die may be spread out for ease in contacting or arrangement for use with high frequency testers.

Figure 1:
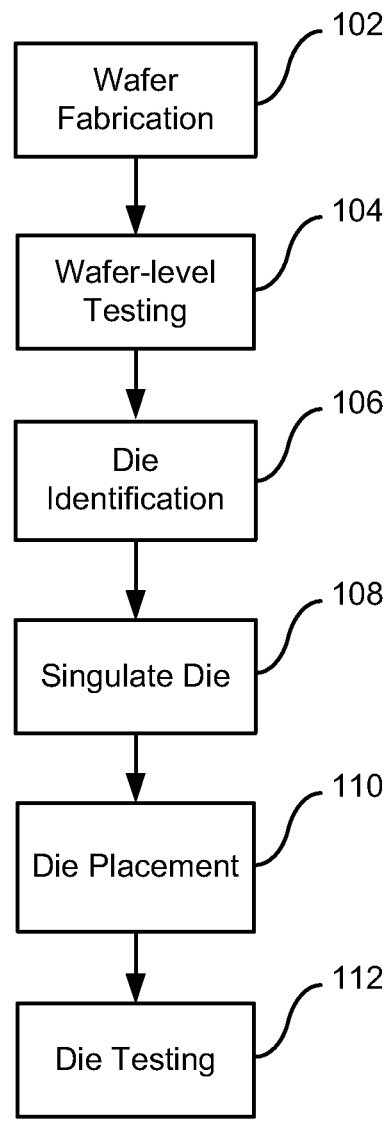
FIG. 1 illustrates an exemplary process for making and testing semiconductor dies according to some embodiments of the invention.

According to some embodiments of the present invention, and referring to FIG. 1, semiconductors are initially fabricated as an array of die on a semiconductor wafer at 102. The wafer can be subjected to wafer level testing at 104. The types of wafer level testing can include testing the die on the wafer for parametric tests in which, for example, the current drawn at the dies' power terminals are measured. In some instances, a laser repair system can process memory test data (in the case of dies which are memories) to determine which of embedded memory rows or columns contain defective cells, determine how to allocate spare rows and columns to repair the memory, and then employ a laser to repair any defective memories. After repairing defective memories, the memories may be again tested while the die are still at the wafer level to ensure that the repair was effective. The die can also be subjected to additional logic or parametric testing at this point, such as functional, open/short, leakage, and AC/DC. Various of these tests can be performed at the wafer level and at various places in the manufacturing. The testing at 104 can associate an identification of the die according to the die's performance on the specific test. For example, some die may be identified as being non-functional and beyond repair, as repairable, or having certain characteristics based on the tests performed. As another example some die may be identified as having shorts, that is, connections between power and ground with little resistance. In some instances the identification of the die according to the various test results can be presented as a wafer map. Selected die can be identified for subsequent testing at 106. The identification process can be based on various types of selection criteria. In general, bad die (as determined by various criteria) are determined early in the testing process so further test resources or processing steps, including steps such as packaging and final test, are not used to test die known to be bad for the intended purpose or as compared against the selection criteria.

The die can then be singulated from the wafer at 108 by various methods. In some embodiments, the wafer is flipped over and placed against a film substrate which holds the wafer in place such that the back side of the wafer is facing upward. The back side of the wafer can be ground down to a specific thickness. A saw can cut the die from the wafer along predetermined paths leaving the die on the film. Other methods can be used to result in singulated die which may or may not be presented on a film substrate.

Regardless of the singulation method, the die can then be picked up from the film or other source of singulated die and individually manipulated by a manipulation system and placed in another location at 110. The manipulation system can produce a die in an active side up or active side down presentation for subsequent placement. It is sufficient that the manipulation system be able to pick up a die and place it in a known location in a known orientation on a surface. In some embodiments, the die can be placed on a testing substrate from which the die can be subjected to further testing of various types at 112. The surface can be a chuck as found in a probing device as described below. The surface can also be a carrier substrate that can be placed on a prober chuck. The carrier substrate can be moved to and/or be adapted for use with different probers and/or different testing stations. The carrier substrate can include means for securing the die in place and/or means for electrically connecting to the die. The manipulation system can be part of or used in conjunction with a prober. Singulated die chosen according to predetermined criteria (such as those which have passed initial wafer testing) can be positioned on the testing substrate by the manipulation system. Singulated die can be placed in reference to the circuitry and/or location of contact pads or other identifying marks on the die rather than the edges of the die. The die can be placed with reference to a landmark on the surface and/or in reference to each other.

Figure 2:
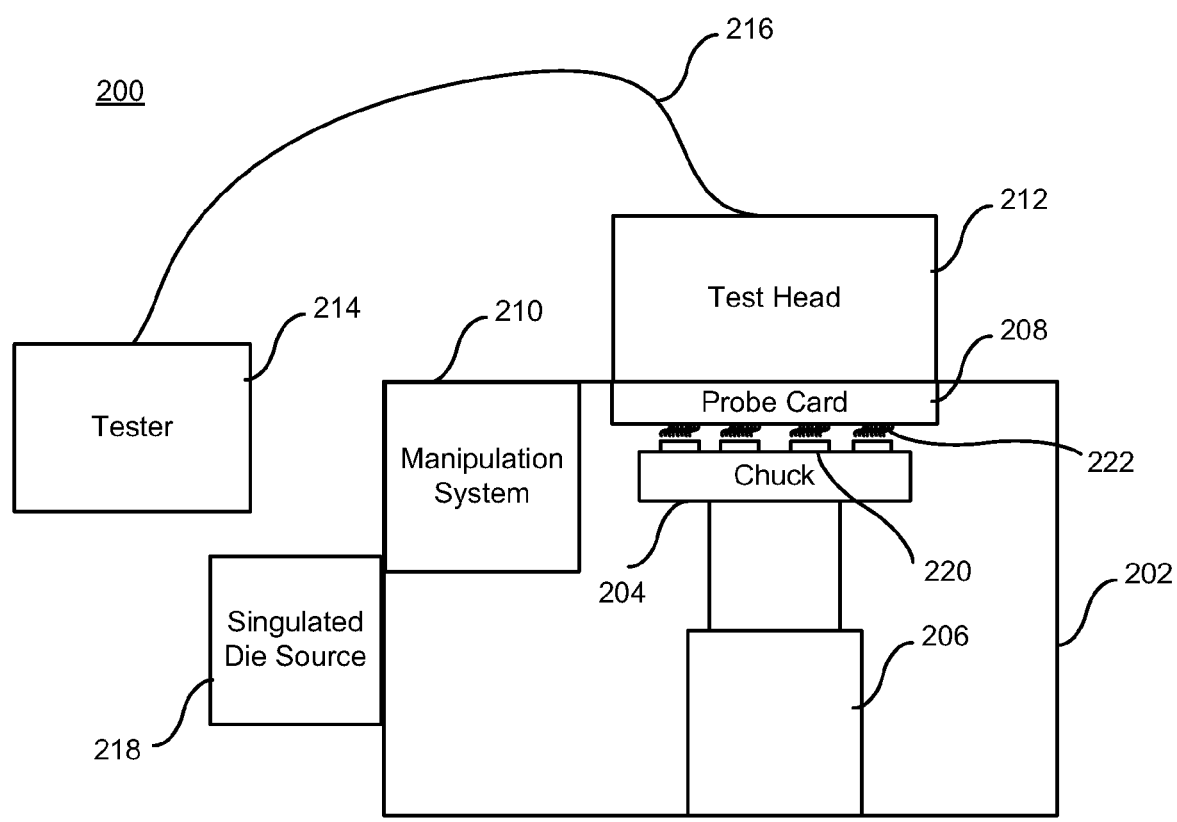
FIG. 2 illustrates an exemplary test system according to some embodiments of the invention.

FIG. 2 illustrates a probing system 200 according to some embodiments of the invention. A prober 202 (which can include a prober housing) includes a chuck 204 and a chuck positioning means 206. The prober can also include a probe card 208. The prober 202 can also include a manipulation system 210. A test head 212 can connect with the probe card 208. The test head 212 can be connected to a tester 214 (e.g., a source of test signals) via a connection 216. Connection 216 can be of various types (e.g., wireless, wired, optical, etc.). Although illustrated as separate components one or more of the components described above can be combined with one or more other components. For example, the manipulation system 210 may be part of the prober 202 or it may be a standalone component.

According to some embodiments of the invention, a manipulation system, such as manipulation system 210 can pick a die from a singulated die source 218 and place it on a prober chuck 204. The manipulation system can comprise, for example, a robotic mechanism (e.g., a robotic arm) configured to pick up a die and place the die at a desired location. Such pick-and-place machines are well known, and any such machine can be used. The singulated die source 218 can contain previously singulated die or a wafer singulation apparatus. The singulated die source may be connected to the prober or stand alone from the prober 202. The die can be held in place by various techniques such as by a vacuum, various types of adhesives, or by electrostatic charges. The prober chuck 204 can include means for maintaining an electrostatic charge. It is sufficient that the die be held in place while the chuck is moved from one position to another.

Figure 3:
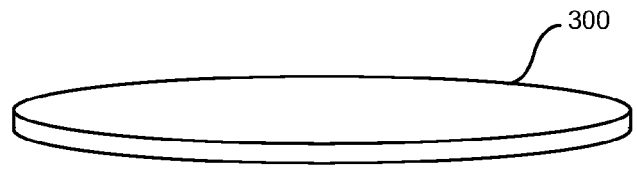
FIG. 3 illustrates an exemplary carrier substrate according to some embodiments of the invention.

As mentioned earlier the die can be placed on a carrier substrate (such as carrier substrate 300 in FIG. 3). The carrier substrate can be substantially planar. The carrier can be provided without the use of recesses. Although shown in an elliptical shape, the carrier substrate 300 can be other shapes as well (such as circular or rectangular). The carrier substrate 300 can include means to hold the die in place such as by a vacuum, various types of adhesives, or by electrostatic charges. The carrier substrate can include means for maintaining an electrostatic charge (e.g., a battery or electrical connection). It is sufficient that the die be held in place while the carrier substrate is moved from one position to another. The carrier substrate can be populated with die by the manipulation system 210 or by other means. For example, the carrier substrate 300 can be populated by another apparatus. The carrier substrate 300 can be adapted for use with more than one type of tester, chuck, test station, probe card and the like.

Referring back to FIG. 2, once the desired number of die (such as die 220) are placed on the chuck 204 in desired positions, the chuck 204 may be moved into position for testing of the die such as by movement to a predetermined position relative to a probe card 208. For example, terminals of ones or all of the die 220 can be brought into contact with ones or all of probes 222. Alternatively, a populated carrier substrate 300 can be placed on the chuck and the chuck moved to the desired location. The carrier substrate 300 can be populated with die by the probing system 200 (e.g., manipulation system 210) or by other means and received in a populated state by the probing system 200.

The probe card can include various types of probes 222 used to establish electrical connection to the individual die 220 (such as bumps, elongate resilient connections, lithographic springs, needle probes, probes tips including truncated pyramids and so on). In some instances electrical connection to the die can be by capacitive coupling (in which case mechanical connection to the die can be eliminated). The connections can also include a combination of mechanical and capacitive coupling to make electrical connection with the die. The die 220 may be tested in parallel as they would if they were still part of the wafer. For example, if the probing system 200 is not able to test all die at the same time, the chuck can be moved to test a predetermined number of die at each position relative to the probing device.

Figure 4A:
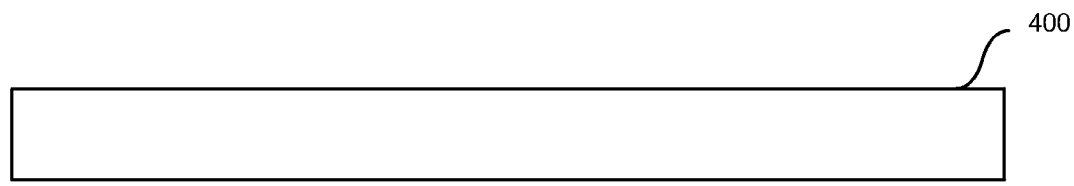
FIGS. 4a-4c illustrate exemplary placement of semiconductor dies on a testing substrate with an intermediate connection device according to some embodiments of the invention.
Figure 4B:
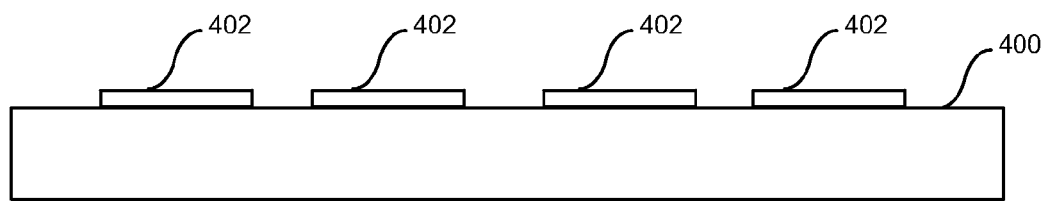
Figure 4C:
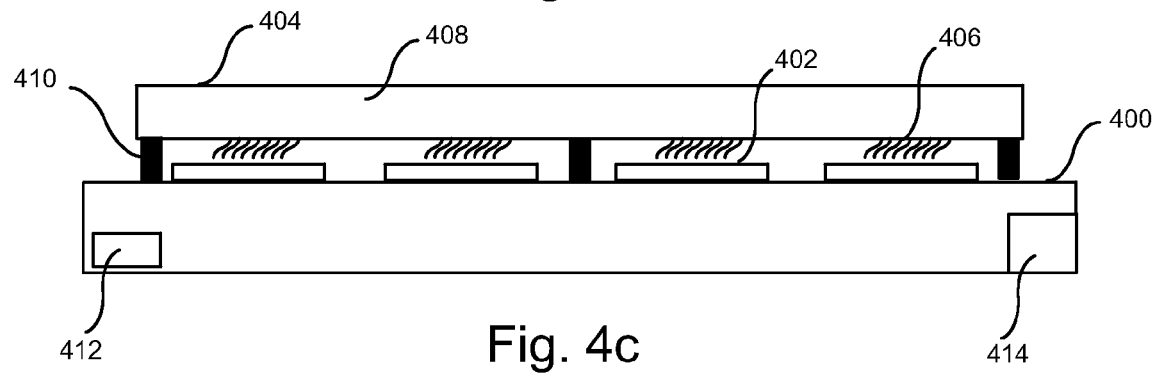

In some embodiments, an intermediary connection device can be placed on the die such as a land grid array (LGA) of conductive pads, a connector or other types of electrical contacts. Referring to FIG. 4a, a testing substrate 400 (such as a chuck 204 or a carrier substrate 300) is illustrated in an unpopulated state. Referring to FIG. 4b, one or more die 402 are positioned on the testing substrate 400. The die 402 can be placed by the manipulation system 210 for example, or other means. It should be noted that FIGS. 4a and 4b are similar to die placement as described in reference to FIG. 2. Referring to FIG. 4c, an intermediate connection device 404 can be positioned over the die 402 such that probe elements 406 on a substrate 408 are aligned with pads on the die 402. Optionally, one or more compression stops 410 can be provided as part of the intermediate connection device 404 or on the testing substrate 400 to prevent over-compression of the probes 406. Compression stops 410 can be any type of structure that limits movement of the substrate 408 towards the testing substrate and thereby defines a minimum spacing between the substrate 408 and the testing substrate 400. Examples of compression stops 410 include posts, bumps, or any other structure that is sufficiently rigid, sturdy, and/or strong to stop movement of the substrate 408 toward the dies 402 (see FIG. 4c) and thus limit compression of probes 400. Probes 406 can extend from substrate 408 by a distance that is greater than the height of the compression stops 410. Consequently, while intermediate connection device 404 is disposed on the compression stops 410, the probes 406 can be compressed against—and thereby form electrical connections with—the dies 402 (e.g., input and/or output terminals (not shown) of the dies 402).

Figure 4D:
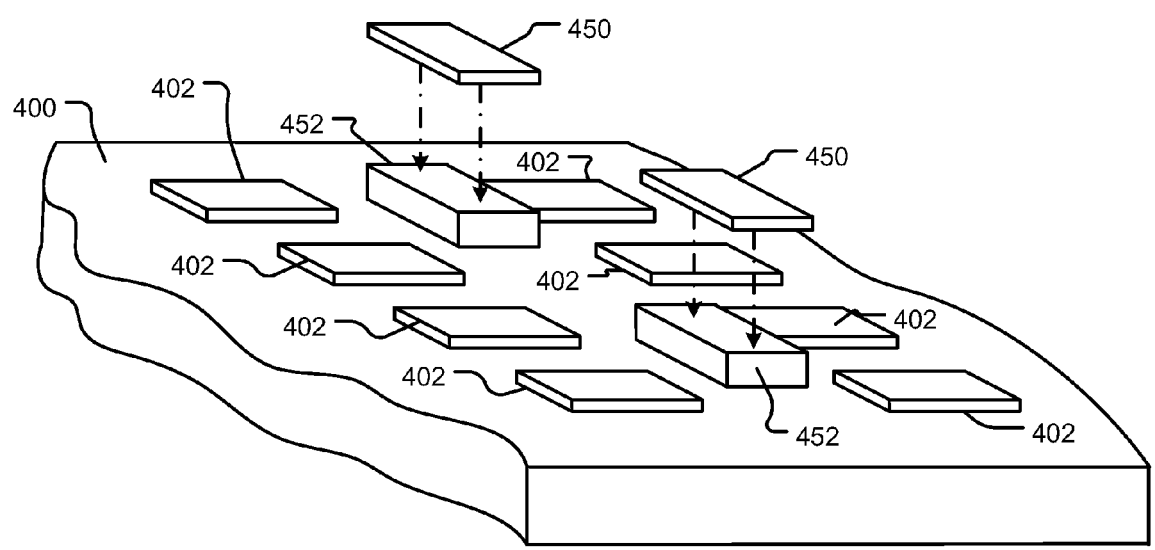
FIGS. 4d and 4e illustrate exemplary use of dies in stop structures on the testing substrate of FIGS. 4a-4c.
Figure 4E:
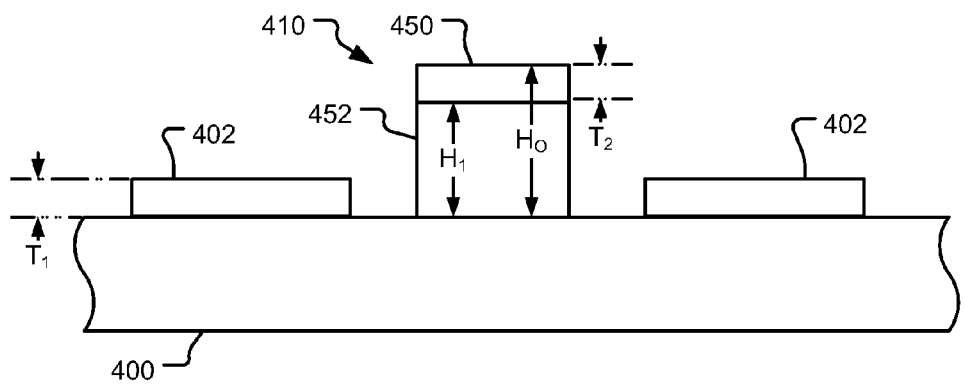

FIGS. 4d and 4e illustrate another non-limiting example of compression stops 410 according to some embodiments of the invention. FIG. 4d illustrates a partial, perspective view of the testing substrate 400 of FIGS. 4a-4c, showing some of the dies 402 (e.g., first dies) that are to be tested and two exemplary stop structures 452, although more or fewer can be used. As shown, compression stops 410 can comprise a stop structure 452 and a die 450, which can be a bad die (e.g., a die that failed any previous inspection or testing, such as testing at 104 of FIG. 1, or as will be seen, testing at 704 of FIG. 7). Stop structures 452 can comprise posts, bumps, or any other structure that is sufficiently rigid, sturdy, and/or strong to stop movement of the substrate 408 toward the dies 402 (see FIG. 4c). As shown in FIGS. 4d and 4e, dies 450 (e.g., second dies) can be placed onto stop structures 452. The dies 450 can be placed onto and held in place on the stop structures 452 using any technique disclosed herein for picking, placing, and/or holding dies in place.

The dies 450 can be dies that were manufactured on the same wafer as the dies 402 placed on the testing substrate 400 to be tested, in which case, the dies 450 will have approximately the same thickness as the dies 402 to be tested. Even if the dies 450 are from a different wafer but are nevertheless from the same manufacturing lot or batch or even from the same manufacturing process as the dies 402 to be tested, the dies 450 can have approximately the same thickness or at least a somewhat similar thickness as the dies 402 to be tested.

FIG. 4e illustrates a non-limiting advantage of a compression stop 410 that comprises a stop structure 452 with a fixed height $H_1$ and a die 450 whose thickness $T_2$ is the same as, approximately the same as, or generally similar to the thickness $T_1$ of the dies 402 to be tested. As should be apparent from FIG. 4e, if the compression stop 410 consisted solely of the stop structure 452, the effective height of the compression stop 410 would be the height $H_1$ of the stop structure 452 less the thickness $T_1$ of the dies 402 to be tested, which as can be seen, can vary with the thickness $T_1$ of the dies 402 to be tested. Thus, the greater the thickness $T_1$ of the dies 402 being tested, the more the probes 406 (see FIG. 4c) would be compressed while intermediate connection device 404 is disposed on stop structures 410. Likewise, the less the thickness $T_1$ of the dies 402 being tested, the less the probes 406 (see FIG. 4c) would be compressed. Thus, the effective height of the compression stop 410 and therefore the level to which the probes 406 are compress while substrate 404 is disposed on the compression stops 410 (see FIG. 4c) would vary with the thickness $T_1$ of the dies 402 being tested.

Configured as shown in FIG. 4e, however, the effective height and therefore the level to which the probes 406 are compress while substrate 404 is disposed on the compression stops 410 (see FIG. 4c) can be made to vary less or not at all even as different dies 402 with different thicknesses $T_1$ are placed on testing substrate 400 and tested. This is because the die 450 adds its thickness $T_2$ to the overall height $H_O$ of the compression stop 410. As long as the thickness $T_2$ of the die 450 is the same as, approximately the same as, or similar to the thickness $T_1$ of the dies 402 to be tested, the effective height of the compression stop 410 will be or will approximately be the height of the stop structure $H_1$. Thus, as testing substrate 400 is used over time to test different types of dies 402 with different thicknesses $T_1$, and as different corresponding dies 450 with the same or similar thicknesses are used in compression stops 410 as shown in FIGS. 4d and 4e, the effective height of the compression stop 410 and therefore the level to which the probes 406 are compress while substrate 404 is disposed on the compression stops 410 (see FIG. 4c) will be the same or approximately the same and will generally not vary with the thickness $T_1$ of the different types of dies 402 tested.

Regardless of the particular structure or configuration of the compression stops 410, the compression stops 410 can also provide a planarization function for the intermediate connection device 404. That is, the compression stops can be set at heights such that when the intermediate connection device is compressed from above, it becomes more planar. The compression stops 410 can be designed to be adjusted to different heights while connected to the intermediate connection device 404 and/or the testing substrate 400. The probes 406 can be similar to the probes 222. The intermediate connection device 404 can be placed by the manipulation system 210 for example. The intermediate connection device 404 can be placed by other mechanisms. When using a carrier substrate 300 as the testing substrate 400, the assemblies illustrated in both FIGS. 4b and 4c can be assembled by or separately from the probing system 200 and/or can be moved from one location to another such as different test locations, stations, probers, and so on. The intermediate connection device 404 can provide electrical connection from the probes 406 to the upper surface of the intermediary connection device 404. The connection on the upper surface of the intermediate connection device 404 can be at a pitch greater than the probe 406 pitch.

In some embodiments, the compressive force of intermediate connection device 404 on die 402 provides enough force that the die 402 need not be held in place on the testing substrate by any other means. The die can be placed on the testing substrate 400 without means to hold the die in place after which the intermediate connection device 404 is placed on the die 402. Alternatively, the holding means (such as a vacuum or electrostatic) can be used to hold the die 402 until the intermediate connection device 404 is placed on the die 402 after which the holding means can be removed or disabled.

Although illustrated as a single intermediate connection device 404, a plurality of intermediate connection devices can be provided each contacting one or more of the die 402. Each of the plurality of intermediate connection devices can be individually placed. A plurality of intermediate connection devices can reduce the requirement for a single intermediate connection device of large area. Some materials may suffer from warping as the surface area becomes large.

The intermediate connection device 404 can be adapted to provide an interface from a probe card and/or test head such that the assembly of FIG. 4c can be moved into position to test the die 402 using the probe card and/or test head. For example, when the testing substrate 400 is chuck 204, the assembly can be moved in relative position to the probe card 208 such that the probes on the probe card contact the contacts on the upper surface of intermediate connection device 404. Alternatively, the assembly can be moved in relative position to the test head 212 for connection directly with the test head 212. One or more interfaces can be provided between the intermediate connection device 404 and the test head 212.

Different intermediate connection devices 404 can be adapted for different phases of testing. For example, one intermediate connection device 404 can be adapted for burn-in testing and another for high frequency testing. The intermediate connection device 404 can be chosen based on the desired test. Intermediate connection devices 404 can be replaced from one testing station to another. For example, an intermediate connection device 404 designed for burn-in testing can be removed after burn-in testing and replaced with one designed for high frequency testing prior to high frequency testing. Intermediate connection devices 404 can also be adapted for different test heads, probe cards and the like. In some embodiments, the intermediate connection device 404 provides a standardized platform to electrically connect to the die below. Accordingly the same intermediate connection device 404 can be used with different types of testing devices. The testing devices need only understand how to interact with the connection surface of the intermediate connection device 404. One or more additional interconnection mediums can be provided between the interconnection device 404 and a connection surface to be contacted by a probe card and/or test head.

The testing substrate 400 can include a storage means 412. The storage means 412 can store information identifying particular die 402 and their test results and/or identification (such as originating wafer location). The storage means 412 can include processing circuitry.

The testing substrate 400 can include environmental control means 414 which can be used to control the environmental conditions of the testing substrate 400 (such as heating or cooling). The environmental control means 414 can include processing circuitry. Alternatively, the testing substrate can be adapted to interface with an environmental control system.

Once the probes 406 of the intermediate connection device 404 are brought into contact with the dies 402 as shown in FIG. 4c, which, as shown, can include disposing the intermediate connection device 404 on the compression stops 410, test signals can be provided from a tester (not shown in FIG. 4c), such as tester 214 (or any other tester disclosed herein), through the intermediate connection device 404 and probes 406 to the dies 402. Response signals generated by the dies 402 in response to the test signals can be sensed by probes 406 and provided to the tester through the intermediate connection device 404. The tester can then analyze the response signals to determine if the response signals are as expected and thus whether individual dies 402 passed or failed the testing.

Figure 5A:
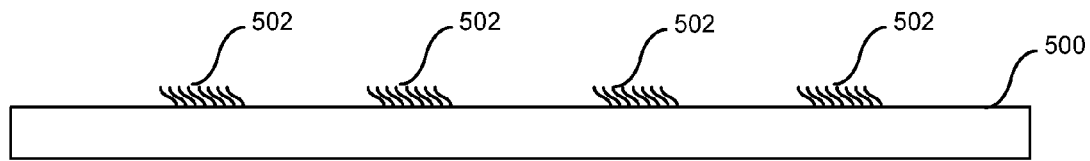
FIGS. 5a-5c illustrate exemplary placement of semiconductor dies on a testing substrate comprising probes with an intermediate connection device according to some embodiments of the invention.
Figure 5B:
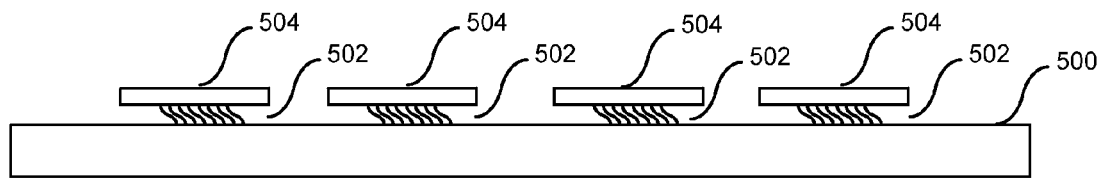
Figure 5C:
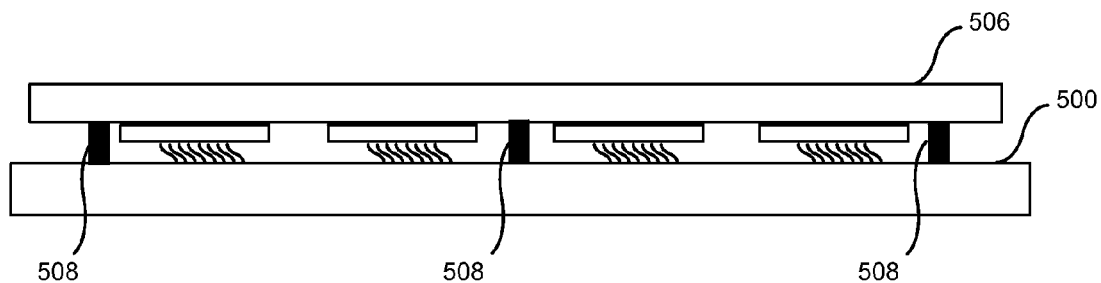

FIGS. 5a-5c illustrate alternative embodiments. Referring to FIG. 5a a testing substrate 500 (such as chuck 204 or carrier substrate 300) includes probes 502 (similar to probes 222 described above). Electrical connection can be provided from the probes 502 to locations on the testing substrate 500. For example, the testing substrate 500 can include contact pads on the surface opposite the surface to which the probes 502 are attached. Alternatively, electrical pathways from the probes 502 to other locations on testing substrate 500 can be provided. The electrical pathways can provide a connection for the test signals to reach the probes 502 from the tester interface to testing substrate 500. Die 504 can be aligned and placed, active side down, on probes 502. Gravity can hold the die 504 in place on the probes 502. Test signals can be provided via the electrical pathways to test the die 504. Optionally, a weight 506 can be provided as illustrated in FIG. 5c to increase the compression force between the surface of the die 604 and the probes 502. Optional compression stops 508 can be provided on the testing substrate 500 and/or weight 506 to prevent over-travel of the probes 502 due to the compressive force on the die 504. The compression stops 508 can be designed to be adjusted to different heights while connected to the weight 506 and/or the testing substrate 500. Compression stops 508 can be like compression stops 410. When the testing substrate is a carrier substrate 300 the assemblies of FIGS. 5b and 5c can be assembled by or separately from the probing system 200 and/or can be moved from one location to another such as different test locations, stations, probers, and so on.

Figure 6:
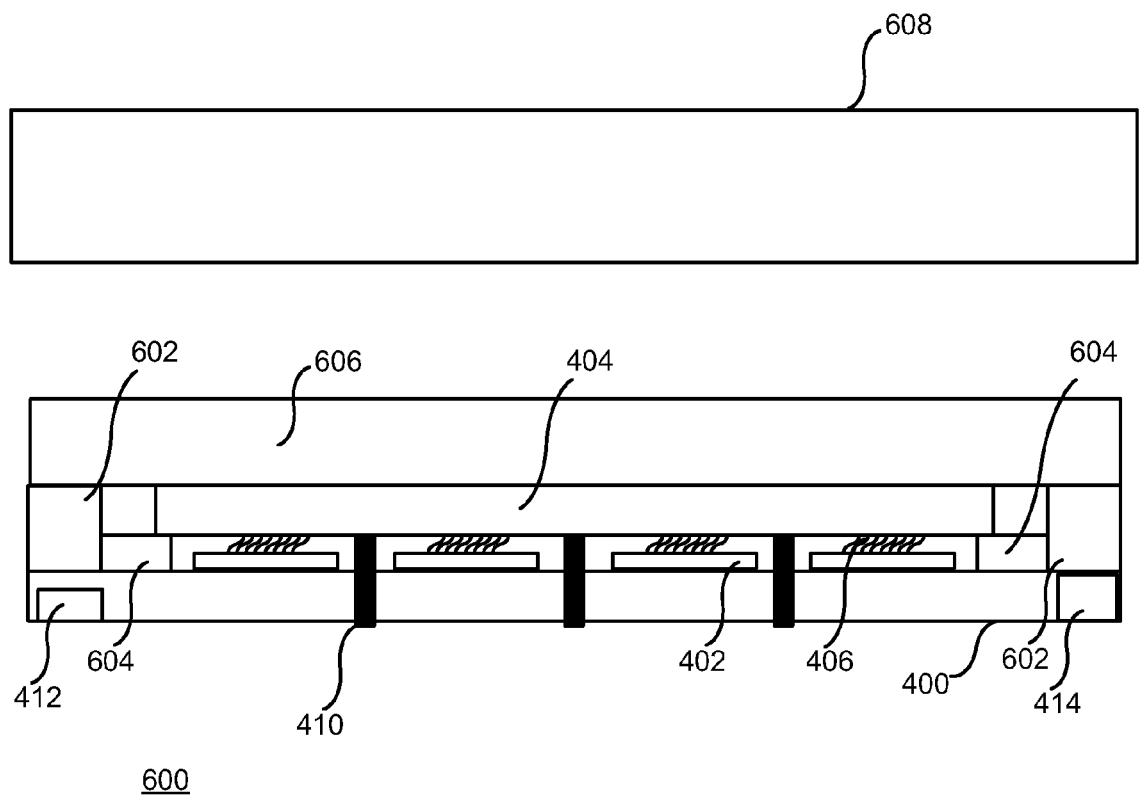
FIG. 6 illustrates an exemplary testing substrate with dies and an intermediate connection device connecting the dies in a testing device according to some embodiments of the invention.

FIG. 6 illustrates an assembly of FIG. 4c, where the testing substrate 400 is a carrier substrate 300, as part of a larger carrier assembly 600. Items numbered similarly to those of FIG. 4 can be as previously described. The assembly 600 can include sidewalls 602 which can be formed separately from or integral with the testing substrate 400. The assembly can optionally include stops 604 which can be used in conjunction with or in place of compression stops 410. Stops 604 can provide a mechanical ledge upon which the intermediate connection device 404 can be placed. A top 606 can also be provided. The top 606 can provide electrical connection from points on the upper surface of the intermediate connection device 404 to an outer surface the top 606, such as the upper surface. A testing device 608 (such as a probe card and/or test head) can connect with the top 606 to effect testing of the die 402. The top 606 can also be used when transporting the assembly from one location to another and removed to allow a testing device to connect with the intermediate connection device. The assembly can be adapted to provide degrees of environmental isolation for the inside of the assembly such that the assembly can be populated with die in a room of one degree of cleanliness and, after closure, moved to another room of different cleanliness while preserving the initial cleanliness for the die. For example, the die can be placed into the assembly 600 in a clean room (e.g., a class 10 room) and moved to another room for testing (e.g., a class 1000 room) without exposing the die to the dirty environment.

The die can be placed on the testing substrate 400 (such as chuck 204 and/or carrier substrate 300) according to various desired criteria. For example, the die can be placed in a pattern to match probing contacts on the probe card 208. The die placement pattern can be adapted or chosen based on commonality of pattern for use in a plurality of subsequent test stations. For example, the die can be maintained in the same configuration pattern for high frequency, and burn-in, and final testing. The placement of the die can be chosen to facilitate certain testing situations. For example, die placement can be chosen to address reducing the effects of substrate noise or die current leakage. Die placement can take into consideration heat dissipation of die under anticipated test conditions.

Figure 7:
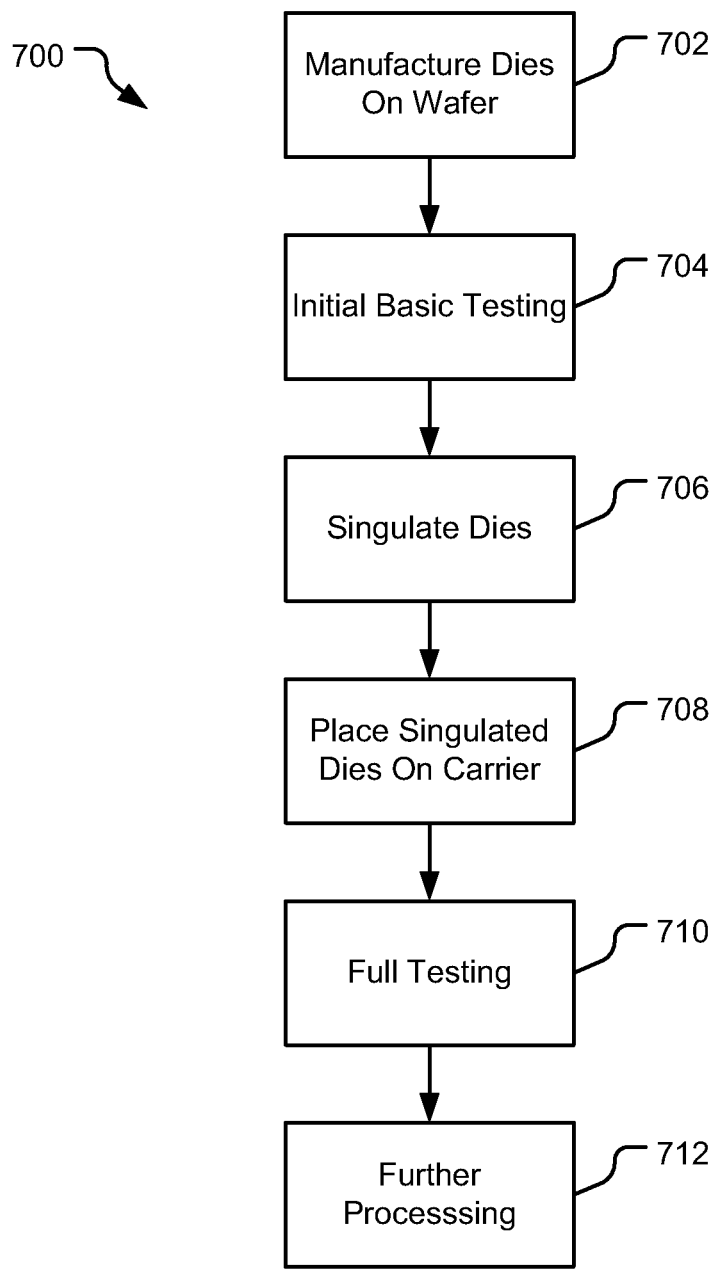
FIG. 7 illustrates an exemplary process for making, testing, and further processing semiconductor dies according to some embodiments of the invention.
Figure 8:
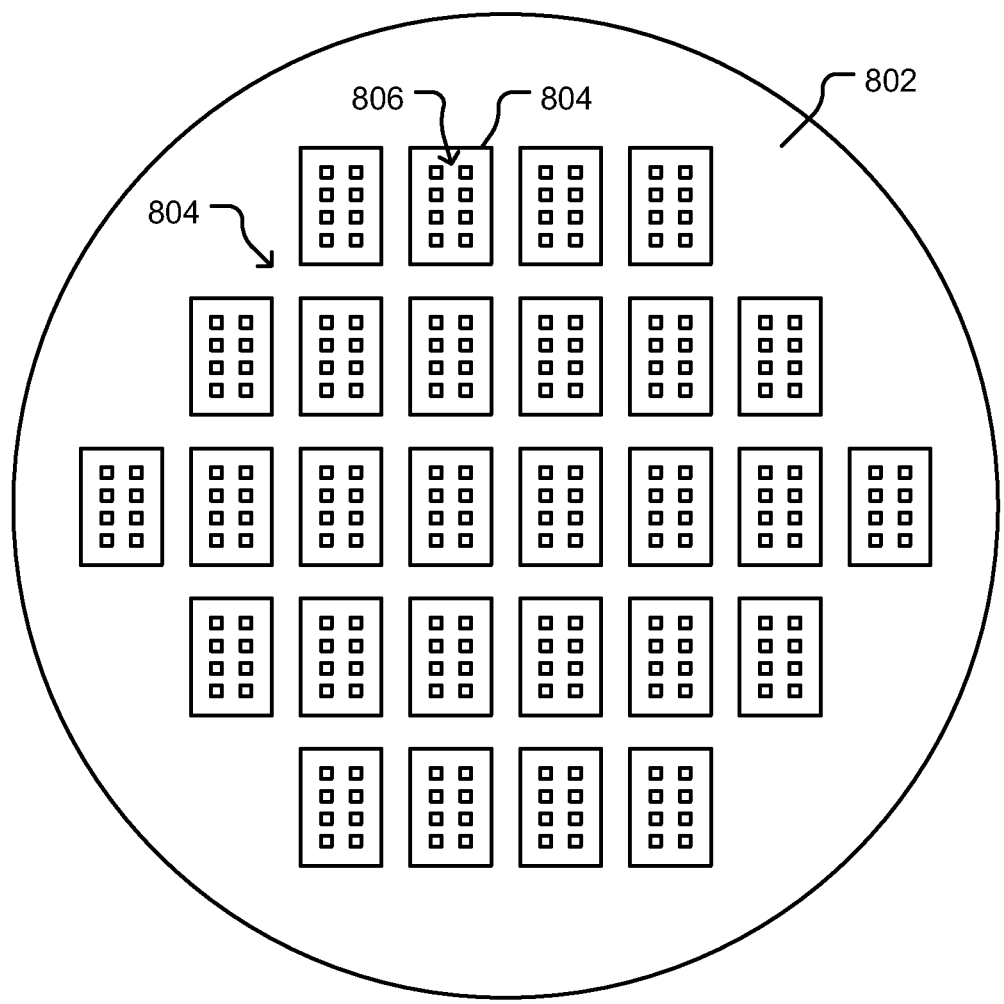
FIG. 8 illustrates an exemplary semiconductor wafer on which dies are made according to some embodiments of the invention.

FIG. 7 illustrates an exemplary process 700 that can include manufacturing, testing, and further processing of semiconductor dies according to some embodiments of the invention. As shown, process 700 can include manufacturing semiconductor dies on a wafer at 702. As is known, dies comprising circuitry integrated into a semiconductor material can be made many at a time, for example, as generally described above with respect to FIG. 1. FIG. 8 illustrates an exemplary wafer 802 with a plurality of dies 804 manufactured on the wafer 802. As is known, each die 804 can include circuitry integrated into a portion of the wafer 802, and each die 804 can include bond pads or other electrically conductive terminals that provide input and output connections to and from the circuitry. In FIG. 8, 28 dies 804 are shown on wafer 802, and each die 804 is shown with eight terminals 806 (e.g., bond pads or other types of terminals), although more or fewer dies 804 can be made on a wafer 802, and each die 804 can have more or fewer terminals 806. Moreover, the pattern of the dies 804 on wafer 802 and the pattern of the terminals 806 on the dies 804 shown in FIG. 8 are exemplary only and other patterns can be implemented.

The circuitry integrated into the dies 804 can be any type of circuitry, including without limitation any type of digital, analog, or mixed digital and analog circuitry. Non-limiting examples include memory circuits, processor circuits, controller circuits, logic circuits, amplifier circuits, etc. The wafer 802 can be made of any semiconductor material including without limitation silicon, gallium arsenide, etc. The circuitry (not shown) can be formed on each die 804 using any method for forming integrated circuitry into a semiconductor material now known or later developed. Alternatively, dies 804 can be optical devices or a combination of optical and electrical devices.

As is known, the dies 804 can eventually be singulated from the wafer 802 and can then be packaged. Alternatively, packaging for the dies 804 can be formed on the wafer 802 before the dies 804 are singulated from the wafer 802. For example, wafer level packaging (WLP) techniques can be used to form packaging on the wafer 802 prior to singulating the dies 804 from the wafer 802. Many WLP techniques are known, and any WLP technique now known or later developed can be used to form packaging for each die 804 on wafer 802.

Figure 9:
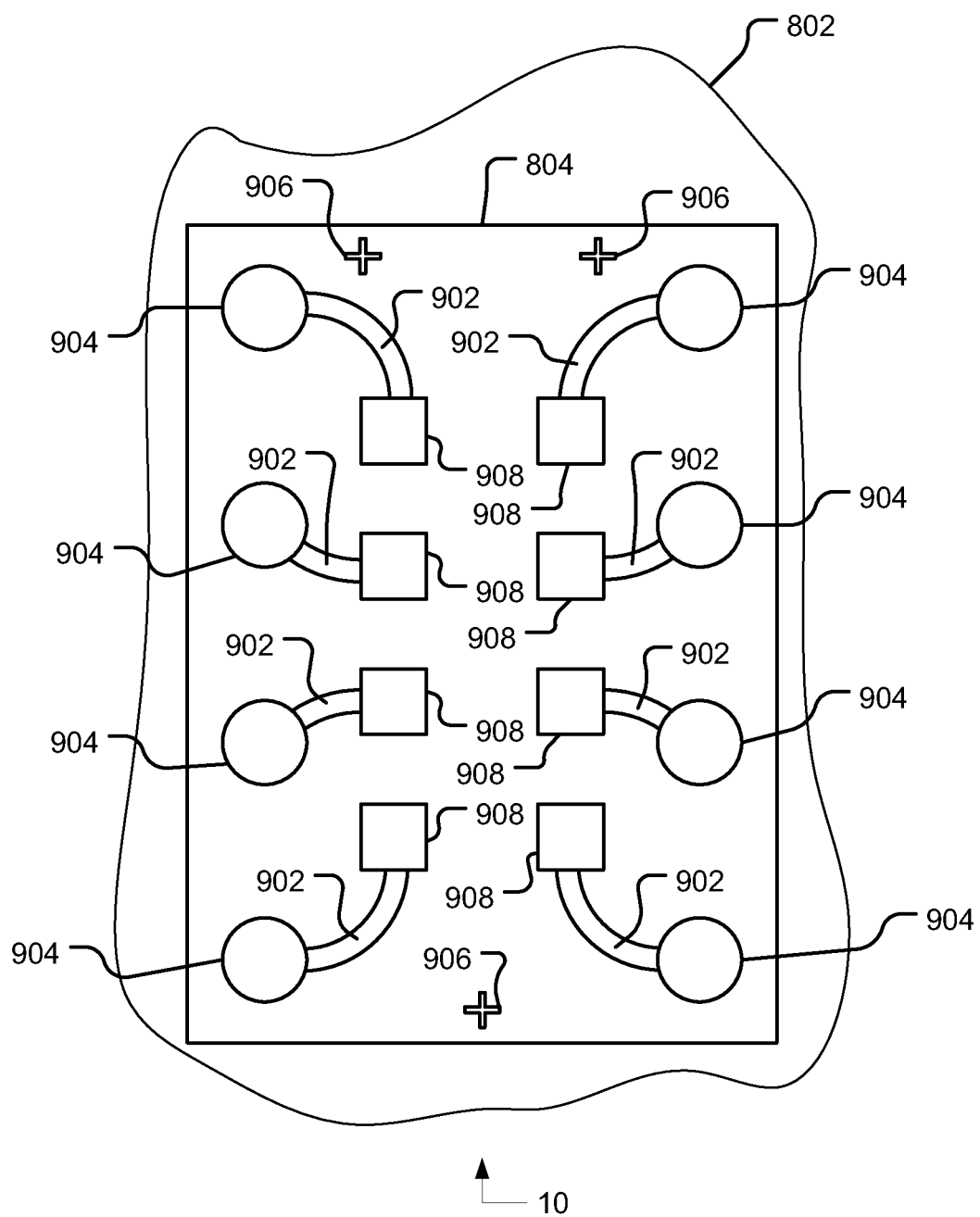
FIGS. 9 and 10 illustrate exemplary wafer level packaging that can be formed on the dies of the wafer of FIG. 8 according to some embodiments of the invention.
Figure 10:
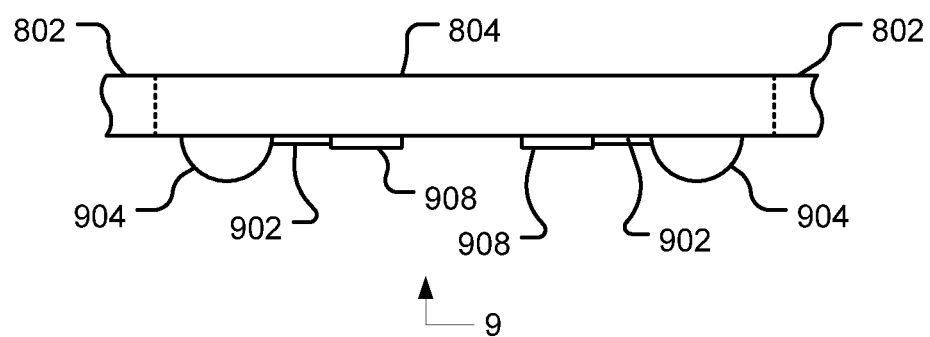

FIGS. 9 and 10 illustrate an exemplary WLP package formed on one die 804 according to some embodiments of the invention. Elements 908 in FIGS. 9 and 10 can be the native bond pads of the die 804. For ease of illustration, only one die 804 is shown in FIGS. 9 and 10. Similar WLP packaging can, however, be formed on each of the dies 804 of wafer 802. As shown, the exemplary WLP package shown in FIGS. 9 and 10 can include redistribution traces 902 and interconnection elements 904 (e.g., packaging terminals). The redistribution traces 902 can be any electrically conductive material suitable for electrically connecting a bond pad 908 of the die 804 to an interconnection element 904. Examples of suitable materials include metals (e.g., copper, gold, etc.), conductive polymers, materials with embedded metal particles, etc. Redistribution traces 902 can be formed using any method suitable for forming such traces on a semiconductor die. For example, traces 902 can be made in the same way that metal interconnection layers that form part of the circuitry of the die 804 are made.

The interconnection elements 904 can be the means by which the circuitry of the die 804 electrically connects to another electronic device (e.g., a printed circuit board, a flex circuit, another die, etc.). Interconnection elements 904 can therefore by any elements suitable for making electrical connections with another electronic device. Examples of suitable interconnection elements 904 include solder balls, conductive bumps, conductive posts, conductive beams, conductive wires, etc. Although the exemplary interconnection elements 904 are illustrated in FIGS. 9 and 10 as semi-spheres, the interconnection elements 904 can be many other shapes.

Although not shown in FIGS. 9 and 10, WLP packaging formed on dies 804 can also include one or more additional materials. For example, a protective layer of material (e.g., a passivation layer) can be deposited over the die 804, including bond pads 908 and the redistribution traces 902. Openings (not shown) can be provided in such a protective layer for interconnection elements 904.

The WLP packaging shown in FIGS. 9 and 10 is exemplary only, and other WLP packaging can alternatively be formed on dies 804. As yet another alternative, packaging other than WLP packaging can be formed on dies 804. For example, chip scale packaging (CSP) can alternatively be applied to dies 804. As yet another alternative, no packaging need be applied to the dies 804. That is, the dies 804 can be bare and unpackaged, in which case the bond pads 908 can provide input to and output from the internal circuitry of the die 804.

As used herein, the term "terminal" refers to any electrical structure on a die that provides input into and/or output from the die 804. The term "terminal," and the depiction of terminals 806 in the drawings, thus refers to any such electrical structure including but not limited to native bond pads (e.g., bond pads 908) of the die or any interconnection element (e.g., 904) added to the die 804, for example, as part of packaging.

Regardless of the type of packaging formed on dies 804, or whether any packaging is formed on dies 804, dies 804 can include alignment marks 906 as shown in FIG. 9. As will be seen, the alignment marks 906 can be used to align the dies 804, for example, in placing singulated dies 804 onto a carrier (see 708 of FIG. 7). Although three alignment marks 906 are shown in FIG. 9, more or fewer can be used. Moreover, alignment marks 906 can take other forms and/or shapes and can be placed in different locations and/or patterns than shown in the example of FIG. 9. As yet another alternative, dies 804 need not include alignment marks, such as alignment marks 906. In yet another alternative, an optical device can use a die 804 feature or features (e.g., one or more corners of the die 804, a terminal 806, etc.) to determine an orientation of the die 804.

Referring again to FIG. 7, once manufactured at 702, the dies 804 can be tested at 704. The testing at 704 can be basic, fast tests designed to identify dies 804 with gross defects. For example, the initial basic testing at 704 can perform tests designed to determine whether a die 804 has any of the following faults: a terminal 806 or other portion of the circuitry of the die 804 is shorted to a power distribution line; a power input terminal (e.g., one of terminals 806) draws excessive current; or one of terminals 806 has an open circuit or a short circuit fault. Other examples of testing that can be part of the initial basic testing at 704 can include determining whether the die 804 properly responds to the application of power to the die 804, and determining whether the die 804 responds to one of a few basic functions the circuitry of the die 804 is designed to perform. For example, if the die 804 is a memory die (e.g., the die 804 includes digital memory circuitry) or includes a memory (e.g., cache memory), one or a few basic read and write operations can be performed on the die at 704. Such basic read and/or write operations can be designed not to test exhaustively whether the die 804 responds properly to all possible data patterns that can be written to and/or read from the die 804 but merely to determine whether a read and/or write operation can be performed on the die 804. Alternatively, the initial basic testing at 704 can be skipped and, for example, performed later. For example, the initial basic testing at 704 can be performed at 710.

At 706, the dies 804 can be singulated from wafer 802. Dies 804 can be singulated from wafer 802 in the same or similar ways as described above with respect to 108 of FIG. 1. Dies 804 that did not pass initial basic testing at 704 can be discarded. Sequentially or simultaneously, 702, 704, and 706 of the process 700 of FIG. 7 can be performed to produce a plurality of singulated dies 804 from a plurality of wafers 802.

At 708, ones of the singulated dies 804 can be placed on a test carrier. For example, dies 804 can be placed on the carrier substrate 300 of FIG. 4, the testing substrate 400 of FIGS. 4a, 4b, and 6, the testing substrate 500 of FIGS. 5a-5b in the same way that dies 402 or 504 are placed on carrier substrate 300, testing substrate 400, or testing substrate 500 as described above. For example, the dies 804 can be placed on carrier substrate 300 or testing substrate 400 positioned such that terminals 806 align with probes 222 or probe elements 406. Similarly, dies 804 can be placed on testing substrate 500 such that terminals 806 align with probes 502.

Figure 11:
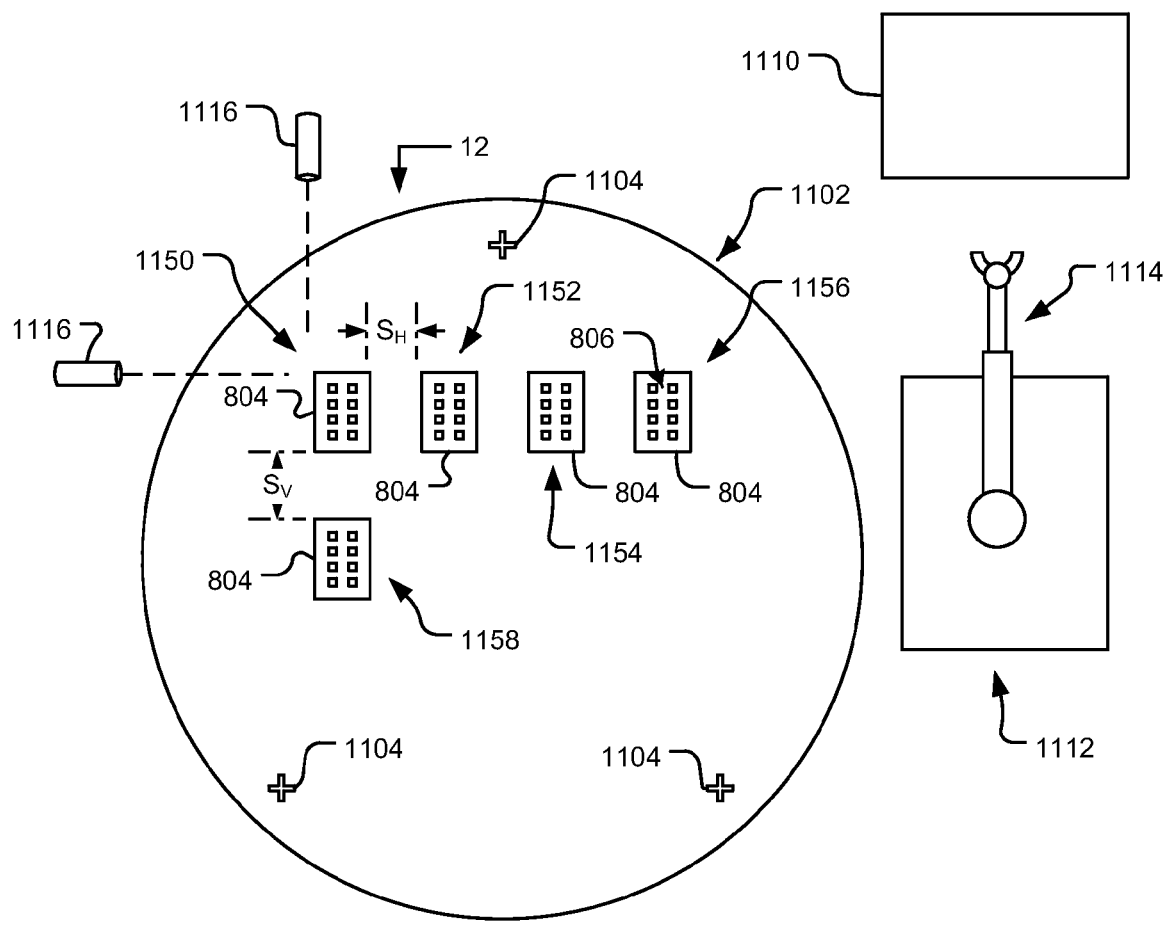
FIGS. 11-13 illustrate exemplary placement of dies on a carrier substrate according to some embodiments of the invention.
Figure 12:
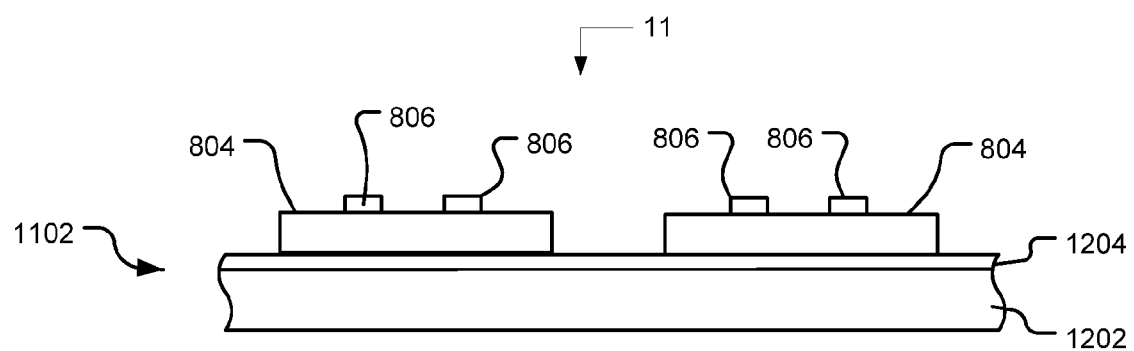
Figure 13:
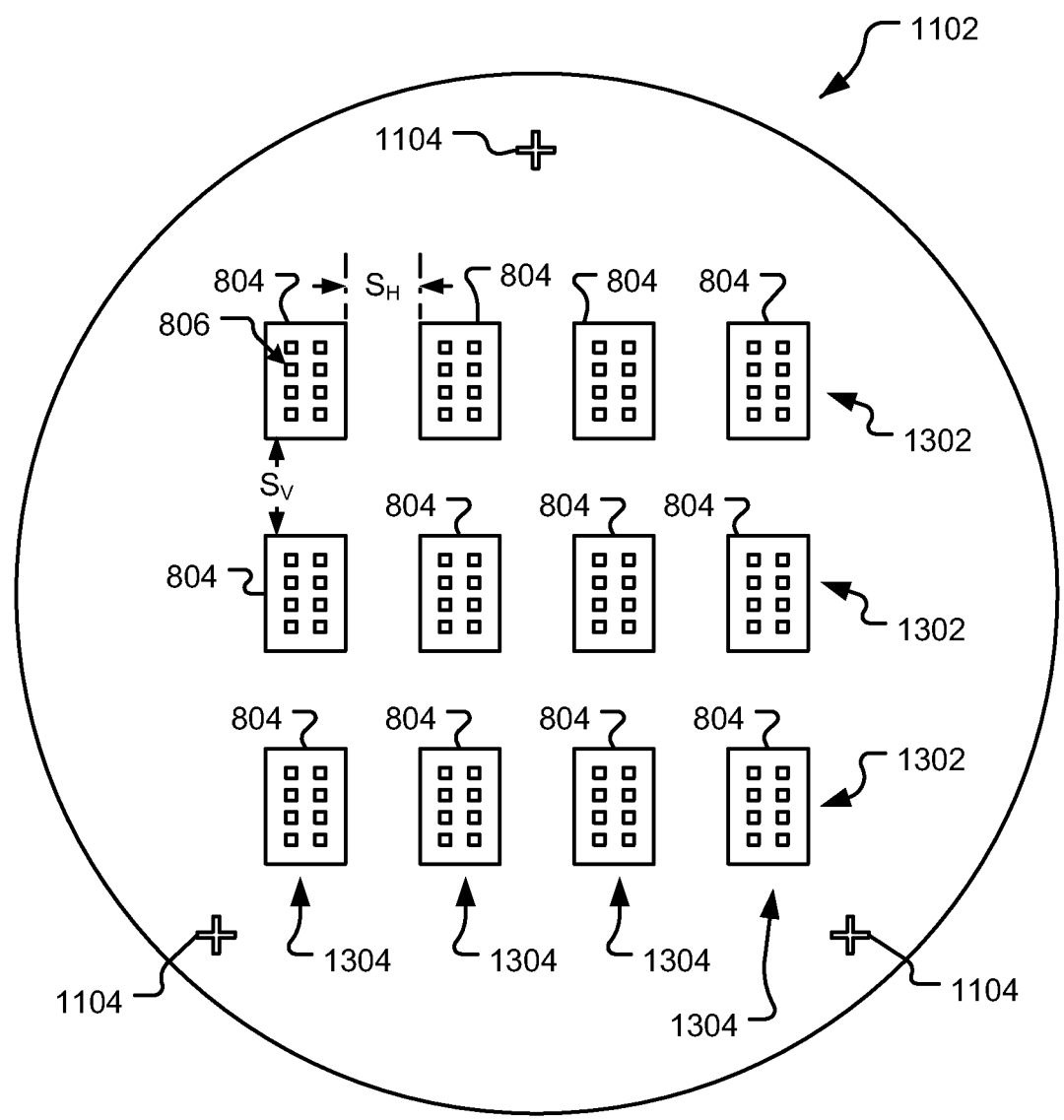

FIGS. 11-13 illustrate an example in which singulated dies 804 can be placed on a carrier 1102. As used herein, the term "carrier" is intended to include any substrate, structure, or surface of a structure on which singulated dies 804 can be placed. The term "carrier" includes but is not limited to a testing substrate. Carrier 1102 can be any substrate, structure, or portion of a structure (e.g., a surface of a structure) suitable for supporting a plurality of the dies 804. For example, the carrier 1102 can be the chuck 204 of the system 200 of FIG. 2. As another example, the carrier 1102 can be a substrate suitable for supporting dies 804. For example, carrier 1102 can be a semiconductor substrate, such as a blank silicon wafer. As yet another example, the carrier 1102 can comprise an apparatus consisting of a plurality of parts. The carrier 1102 can include a flat surface on which the dies 804 can be placed.

In some embodiments, the carrier 1102 can comprise material that is the same as material comprising the wafer 802 on which dies 804 are made. For example, the carrier 1102 and the wafer 802 can comprise a semiconductor material (e.g., silicon). If the carrier 1102 comprises material that is the same as or similar to the material of wafer 802 (and thus dies 804), the carrier 1102 and the dies 804 can have the same or similar coefficients of thermal expansion and can thus expand or contract similarly in response to temperature changes. The carrier 1102 can be other shapes than the circular shape shown in FIGS. 11 and 13. For example, the carrier 1102 can be oval, rectangular, square, etc. shaped.

In some embodiments, the carrier 1102 can comprise a backing substrate 1202 and a tacky or sticky film 1204 disposed on the backing substrate 1202 as shown in FIG. 12. The tacky or sticky film 1204 can hold the singulated dies 804 on the carrier 1102 in place so that the dies 804 do not move appreciably on carrier 1102. Alternatively, the carrier 1102 can include other mechanisms for holding dies 804 in place, including without limitation any of the mechanisms discussed above with respect to FIGS. 1-6. For example, a vacuum, electrostatic forces, etc. can be used to hold dies 804 in place on carrier 1102. Carrier 1102 can thus include mechanisms for creating a vacuum, electrostatic forces, etc. As another example, mechanical mechanisms (e.g., clamps) can be used to hold the dies 804 in place. As yet another example, a weight (e.g., like weight 506) can hold dies 804 in place on carrier 1102, which need not include sticky film 1204. As yet another example, the force of probes (e.g., like 406 of FIG. 4b, probes 502 of FIG. 5b, or other probes disclosed herein (e.g., probes 1410 of FIGS. 14 and 15)) pressed against terminals 806 of the dies 804 can hold the dies 804 in place on carrier 1102. Thus, carrier 1102 can but need not include sticky film 1204. In some embodiments carrier 1102 can comprise only substrate 1202, and in other embodiments carrier 1102 can comprise an assembly of structural elements that form the carrier 1102.

Carrier 1102 can also include stop structures (not shown), such as stop structures 410, 508 of FIGS. 4c-e, 5c, and 6.

As shown in FIG. 11, whether the carrier 1102 is the chuck 204 of probing system 200 (see FIG. 2), a substrate, or another structure, singulated dies 804 can be picked out of a storage container 1110 (which can be any storage container suitable for storing or obtaining semiconductor dies (e.g., singulated die source 218 of FIG. 2)) and placed on the carrier 1102 by a pick-and-place machine 1112 (e.g., a robotic mechanism) with a robotic arm 1114 (which can be a non-limiting example of the manipulation system 210 of FIG. 2). The robotic arm 1114 can pick singulated dies 804 from the storage container 1110 and place the dies 804 on the carrier 1102. Precision positioning mechanisms can be used to place the dies 804 in precise locations on the carrier 1102. For example, laser positioning mechanisms 1116 can be used to position precisely the dies 804 on the carrier 1102 as shown in FIG. 11. As another example, other optical systems can be used to position precisely dies 804 on the carrier 1102.

Referring to FIGS. 2 and 11, the pick-and-place machine 1112 can be an example of the manipulation system 210 of FIG. 2 and can thus be located in a prober housing (e.g., 202). Moreover, the pick-and-place machine 1112 can place the dies on a surface of the chuck 204, which can thus be the carrier 1102. Alternatively, the pick-and-place machine 1112 can place the dies 804 on a substrate or other structure that is the carrier 1102, and in such a case, the pick-and-place machine 1112 can also place the carrier 1102 on the chuck 204 (either before placing dies 804 on the carrier 1102 or after placing dies 804 on the carrier 1102). Once the dies 804 are on the carrier 1102 and the carrier 1102 is on the chuck 204, or alternatively, once the dies 804 are on the chuck 204 (if the chuck 204 is the carrier 1102), the chuck 204 can be moved to bring terminals 806 of the dies 804 into contact with probes 222 of the probe card assembly 208, and the tester 214 can then provide test signals through the connection 216, test head 212, probe card assembly 208, and probes 222 to the dies 804. Response signals generated by the dies 804 in response to the test signals can be sensed by ones of the probes 222 and provided to the tester 214 through the probe card assembly 208, test head 212, and connection 216. The tester 214 can then analyze the response signals to determine whether the response signals is as expected and thus whether a particular die 804 passes or fails the testing.

As shown in FIGS. 11 and 13, the carrier 1102 can include alignment marks 1104, which can be used to position precisely the dies 804 on the carrier 1102. Alternatively, or additionally (as shown in FIG. 11), a first die 1150 (which can be one of the dies 804 singulated from wafer 802)) can be placed on the carrier 1102, and a second die 1152 (which can be another one of the dies 804 singulated from wafer 802) placed on the carrier 1102 can be aligned with the first die 1150. Each subsequent die (e.g., dies 1154, 1156, 1158) placed on the carrier 1102 can be aligned with one or more of the previously placed dies. As discussed above, dies 804 can include alignment marks 906, which can be used to align dies 804 one with another and/or with alignment marks or features (e.g., 1104) on the carrier 1102. Alternatively or additionally, a feature (e.g., one or more corners of a die terminal 806) of the dies 804 can be used as an alignment feature.

Although FIG. 13 shows the dies 804 placed on carrier 1102 in a pattern comprising threes rows 1302 and four columns 1304 with horizontal spacing $S_H$ between each column 1304 and vertical spacing $S_V$ between each row 1302, the dies 804 can be disposed on carrier 1102 in many different patterns. For example, the dies 804 can be placed on the carrier 1102 in a pattern that is suitable for the particular testing that is to be performed on the dies 804. As another example, the dies 804 can be placed on the carrier 1102 in a pattern that includes a number of dies 804 such that the total number of die terminals 806 in the pattern is as close as possible to the number of connections to and from a tester (e.g., any device configured to control testing of the dies) that will be used to test the dies 804. As yet another example, the dies 804 can be disposed in a pattern that facilitates dissipating heat from the dies 804 during the testing. As still another example, the dies 804 can be disposed in a pattern that reduces cross talk or other forms of electrical interference between signal probes carrying signals to or from the dies 804 during testing of the dies 804.

Although the forgoing examples of particular patterns in which the dies 804 can advantageously be placed on the carrier 1102 are applicable to the use of many different types and configurations of contactor devices with probes for contacting the dies 804 during testing of the dies 804, the exemplary patterns mentioned above will be discussed in more detail with respect to the exemplary contactor device shown in FIGS. 14 and 15. Initially, however, the exemplary contactor device shown in FIGS. 14 and 15 will be described.

Figure 14:
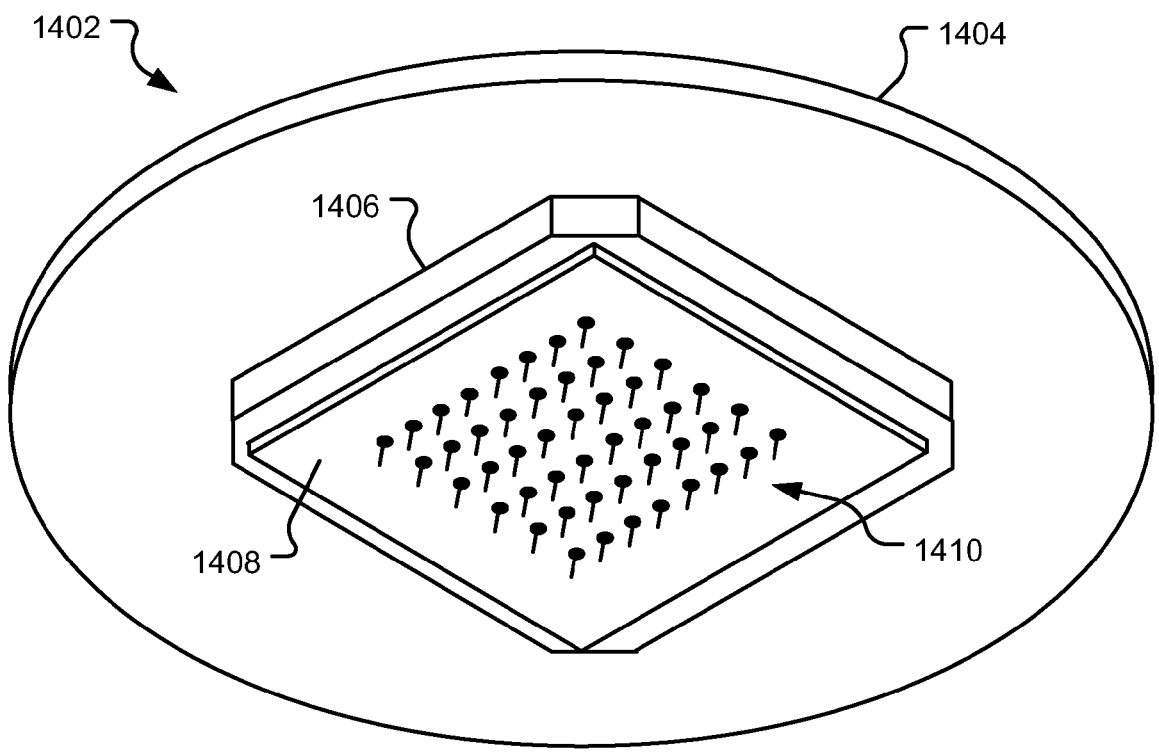
FIG. 14 illustrates a perspective view of an exemplary probe card assembly according to some embodiments of the invention.
Figure 15:
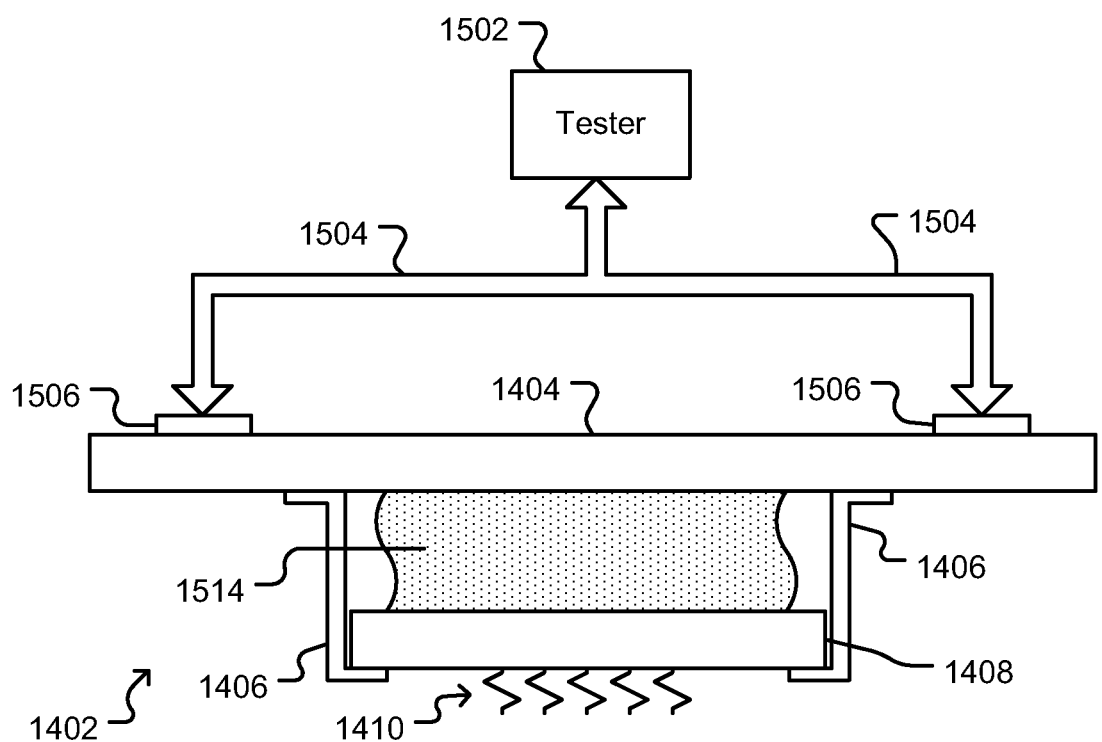
FIG. 15 illustrates a side view of the probe card assembly of FIG. 14.

As shown in FIG. 14 (which shows a bottom, perspective view of the probe card assembly 1402) and FIG. 15 (which shows a side view of the probe card assembly 1402 connected by communications channels 1504 to a tester 1502), probe card assembly 1402, which can be a non-limiting example of the probe card assembly 208 shown in FIG. 2 (and can thus be used in a probing system like system 200 of FIG. 2), can include a wiring substrate 1404, a flexible electrical connector 1514, and a probe substrate 1408. The wiring substrate 1404 can comprise any substrate suitable for supporting electrical connectors 1506, which can electrically connect the probe card assembly 1402 to communications channels 1504 to and from a tester 1502 (e.g., a source of test signals). The wiring substrate 1404 can also include a plurality of electrically conductive paths (not shown) from the electrical connectors 1506 to the flexible electrical connector 1514. The conductive paths (not shown) can be in the form of electrically conductive traces (not shown) and/or vias (not shown) on, in, and or through the wiring substrate 1404.

The probe substrate 1408 can comprise any substrate suitable for supporting the probes 1410. The probe substrate 1408 can also include a plurality of electrically conductive paths (not shown) from the probes 1410 to the flexible electrical connector 1514. The conductive paths (not shown) through the probe substrate 1408 can be in the form of electrically conductive traces (not shown) and/or vias (not shown) on, in, and or through the probe substrate 1408.

The flexible electrical connector 1514 can provide a plurality of electrically conductive paths (not shown) from the wiring substrate 1404 to the probe substrate 1408. The flexible electrical connector 1514 can comprise any type of electrical connections that are sufficiently flexible (or compliant) to maintain electrical connections between the wiring substrate 1404 and the probe substrate 1408 even if the probe substrate 1408 is moved relative to wiring substrate 1404. Although not shown, the probe card assembly 1402 can comprise a mechanism for moving (e.g., rotating, tilting, translating, etc.) the probe substrate 1408 with respect to the wiring substrate 1404. Examples of such mechanisms are disclosed in U.S. Pat. No. 5,974,662; U.S. Pat. No. 6,509,751; and U.S. patent application Ser. No. 11/306,515, filed Dec. 30, 2005. For example, electrical connector 1514 can comprise flexible wires. As another example, electrical connector 1514 can comprise an interposer (e.g., like the interposer 504 disclosed in FIG. 5 of U.S. Pat. No. 5,974,622). A mechanical stiffener (e.g., a metal plate) can be attached to the wiring substrate 1404 to provide mechanical stiffness. Alternatively, a mounting structure (not shown) can be provided for mounting the probe card assembly 1402 to a housing of a test system (e.g., like prober 202 of FIG. 2), and the probe substrate 1408 can be alternatively or additionally moveable with respect to the mounting structure.

The electrical connectors 1506, conductive paths (not shown) through the wiring substrate 1404, the flexible electrical connector 1514, and the probe substrate 1408 can provide individual electrical connections between ones of the channels 1504 and ones of the probes 1410. Brackets 1406 and/or other attachment mechanisms (e.g., clamps, bolts, screws, etc.) can hold the probe substrate 1408, flexible electrical connector 1514, and wiring substrate 1404 together.

The electrical connectors 1506 can comprise any mechanism for providing electrical connections to the communications channels 1504. For example, the electrical connectors 1506 can comprise zero-insertion-force ("ZIF") electrical connectors configured to receive mating ZIF connectors (not shown) at the end of the communications channels 1504. As another non-limiting example, electrical connectors 1506 can comprise pogo pin pads configured to receive pogo pin electrical connectors at the end of communications channels 1504.

The probes 1410 can be resilient, conductive structures. Non-limiting examples of suitable probes 1410 include composite structures formed of a core wire bonded to a conductive terminal (not shown) on the probe substrate 1408, and the core wire can be over coated with a resilient material as described in U.S. Pat. No. 5,476,211, U.S. Pat. No. 5,917,707, and U.S. Pat. No. 6,336,269. Probes 1410 can alternatively be lithographically formed structures, such as the spring elements disclosed in U.S. Pat. No. 5,994,152, U.S. Pat. No. 6,033,935, U.S. Pat. No. 6,255,126, U.S. Pat. No. 6,945,827, U.S. Patent Application Publication No. 2001/0044225, and U.S. Patent Application Publication No. 2004/0016119. Still other non-limiting examples of probes 1410 are disclosed in U.S. Pat. No. 6,827,584, U.S. Pat. No. 6,640,432, U.S. Pat.

No. 6,441,315, and U.S. Patent Application Publication No. 2001/0012739. Other non-limiting examples of probes 1410 include electrically conductive pogo pins, bumps, studs, stamped springs, needles, buckling beams, etc.

The probe substrate 1408 is exemplary only. In some embodiments, the probe substrate 1408 can be replaced with a probe head assembly that comprises a plurality of probe substrates (not shown) to which the probes 1410 are attached, and those probe substrates can be attached to a larger substrate (not shown) or otherwise attached to each other. Each such probe substrate can be independently moveable with respect to the larger substrate. Examples of multiple substrate probe head assemblies are disclosed in U.S. patent application Ser. No. 11/165,833, filed Jun. 24, 2005 and U.S. patent application Ser. No. 11/306,515, filed Dec. 30, 2005.

The test system of FIG. 15 can operate as follows. Tester 1502 can generate test signals to be input through ones of probes 1410 into the dies (e.g., die 804). Tester 1502 can also evaluate response signals generated by the dies (e.g., die 804) in response to the test signals. Tester 1502 can comprise equipment such as one or more computers. The communications channels 1504 can be a plurality of electrical paths to and from the tester 1502. Any mechanism or medium can be used to provide the communications channels 1504. For example, communications channels 1504 can comprise coaxial cables, fiber optics, wireless transmitters and receivers, twisted pairs, electric circuits, driver circuits, receiving circuits, etc. Moreover, each of channels 1504 can comprise multiple medias. For example, ones of channels 1504 can comprise a driver circuit that drives a signal down a coaxial cable to a routing circuit on one or more circuit boards, which in turn provides the signal to an electrical connector that can be connected to the electrical connectors 1506 on the probe card assembly 1402.

As mentioned, in one example of the pattern of dies 804 on carrier 1102 (see FIGS. 11-13), dies 804 can be placed in a pattern such that the terminals 806 of the dies 804 align with probes of a contactor device configured to contact the terminals 806 of the dies 804. For example, as discussed above, probe card assembly 1402 can be an example of a contactor device for contacting dies 804 on carrier 1102. In such a case, dies 804 can be positioned on carrier 1102 such that the terminals 806 of the dies 804 align with the probes 1410 of the probe card assembly 1402. Although the probes 1410 of probe card assembly 1402 are shown in FIG. 14 disposed on a probe substrate 1408 in a rectangular or square array with similar spacing between each probe 1410, probes 1410 can be disposed in many different patterns. Regardless of the particular pattern of probes 1410, dies 804 can be placed on carrier 1102 (e.g., as shown in FIG. 13) such that the terminals 806 of the dies 804 align with the probes 1410.

As also mentioned above, another example of a pattern in which dies 804 can be placed on carrier 1102 correlates the number of terminals 806 of the dies 804 placed on the carrier 1102 with the number of resources available from the tester that will be used to test the dies 804. For example, the number of dies 804 placed on the carrier 1102 can correspond to a number of connections to and from a tester (e.g., like tester 214 of FIG. 2 or tester 1502 of FIG. 15) that will be used to test the dies 804. In one example, the total number of dies 804 placed on the carrier 1102 can be selected to make maximum usage of the available tester resources. Referring to FIG. 15, as discussed above, communications channels 1504 can comprise a plurality of individual communications channels (or paths) to and/or from the tester 1502. With regard to tester 1502, a number N of dies 804 placed on the carrier 1102 can be such that the number N multiplied by the number M of terminals 806 on each die are as close to the number C of communications channels 1506 as possible. In some embodiments, the probe card assembly 1402 can include wiring that fans some of the communications channels 1504 to multiple probes 1410. In such a case, there can be more probes 1410 than communications channels 1504 (some communications channels 1504 being electrically connected through the probe card assembly 1402 to more than one probe 1410). In such a case, the number N of dies 804 placed on the carrier 1102 can be such that the number N multiplied by the number M of terminals 806 on each die are as close as possible to the number P of probes 1410 connected to a communications channel 1504.

In other examples, the number N of dies 804 placed on the carrier 1102 can be such that the number N of dies 804 multiplied by the number M of terminals 806 on each die are as close to an integer multiple I of the number C of communications 1504 and/or the number P of probes 1410 connected to a communications channel 1504. In such a case, the probes 1410 can be brought into contact with a first set of the dies 804, and the first set of the dies 804 can be tested. Carrier 1102 can then be repositioned such that a second set of dies 804 on the carrier 1102 are brought into contact with the probes 1410, and the second set of dies 804 tested. The foregoing process of contacting and testing a set of the dies 804, testing the set of dies 804, and then repositioning the carrier 1102 to contact and test another set of dies 804 can be repeated until all of the dies 804 on the carrier 1102 are contacted and tested, which can require I number of different touchdowns of probes on the dies 804.

As mentioned above, dies 804 can be placed in a pattern that includes sufficient spacing (e.g., vertical spacing $S_V$ and horizontal spacing $S_H$ shown in FIGS. 11 and 13) between dies 804 to allow the dies to dissipate enough heat during testing of the dies 804 to maintain the dies 804 within the manufacturer's specified operating temperature range for the dies 804. What constitutes sufficient spacing to dissipate heat can vary depending on a number of parameters including without limitation the type of die, the number of dies being tested simultaneously, the manufacturer's specified operating temperature range, etc. For example, the particular spacings (e.g., $S_H$, $S_V$) between dies 804 can depend on the wattage generated by the dies 804 during operation and the number of dies 804 placed on the carrier 1102.

The following is another example of a placement pattern for the dies 804 that can facilitate dissipation of heat. The carrier 1102 can be capable of dissipating heat generated by dies 804 at a rate of a particular number W of watts per unit area of the carrier 1102. That number W of watts can depend on the material or materials that the carrier 1102 is made of and can further depend on the particular construction of the carrier. The number W for a particular carrier 1102 can be determined by experiment. The particular spacing (e.g., $S_H$, $S_V$) between dies 804 can be selected so that the number D of dies 804 multiplied by the power rating P (e.g., the manufacture's specification of the number of watts generated by a die 804 during operation of the die) of each die 804 is less than or equal to the total number of watts the carrier 1102 is able to dissipate. In other words, the particular spacing (e.g., $S_H$, $S_V$) or simply the number D of dies 804 placed on the carrier can be as follows: $D*P \leq W*A$ (where D is the number of dies 804 placed on the carrier 1102; P is the power output or consumed or the heat output during operation of a die 804 or power output rating assigned to the dies 804 by the manufacturer of the dies 804; W is the number of watts per unit of surface area that the carrier 1102 is able to dissipate; A is the area of the surface of the carrier 1102 on which the dies 804 are placed; * represents multiplication; and ≦ represents less than or equal).

As also mentioned above, in yet another example of the pattern in which dies 804 can be placed on the carrier 1102, the dies 804 can be placed with sufficient spacing to reduce cross talk or other forms of electrical interference between the dies 804 as multiple dies 804 are tested simultaneously on carrier 1102. Again, what constitutes sufficient spacing to reduce cross talk or other forms of electrical interference can vary depending on a number of parameters including without limitation the type of the dies, the type of signals input into and output from the dies, the frequency at which signals are input into and output from the dies, etc. For example, the particular spacings (e.g., $S_H$, $S_V$) between dies 804 can be selected to reduce cross talk and other forms of electrical interference between the dies 804 on the carrier 1102 to a level that is negligible (e.g., does not interfere with testing the dies 804 at typical operating frequencies of the dies 804).

As another example, the particular spacings (e.g., $S_H$, $S_V$) between dies 804 can be selected to reduce cross talk and other forms of electrical interference between signal probes (e.g., like ones of probes 222 of FIG. 2, ones of probe elements 406 of FIG. 4b, ones of probe elements 502 of FIG. 5a, or ones of probes 1410 of FIGS. 14 and 15) of a contactor device (e.g., like probe card assembly 208 of FIG. 2, intermediate connection device 404 of FIG. 4c, testing substrate 500 of FIG. 5a, and probe card assembly 1402 of FIGS. 14 and 15). In some embodiments, at test frequencies of about 100 megahertz or greater, cross talk and/or other forms of electrical interference between such signal probes can be reduced to negligible levels if the average density of probes is two or fewer per square millimeter of the surface of the substrate to which the probes are attached. For example, if the average density of signal probes 1410 (probes configured to carry test signals to or response signals from the die 804) on the bottom surface of probe substrate 1408 is less than two probes per square millimeter of surface area of the probe substrate 1408, cross talk and other forms of electrical interference can typically be reduced to negligible levels even if the test and/or response signals are switched at frequencies of 100 megahertz or greater. Because the signal probes 1410 contact ones of the signal terminals 806 of the dies 804, by properly spacing (e.g., $S_H$, $S_V$) the dies 804 on the carrier 1102, the density of signal probes 1410 can be kept to two or fewer per square millimeter of the surface of the probe substrate 1408.

In some embodiments, the carrier (e.g., like carrier 1102) can include circuit elements and other circuitry that can be used in testing the dies. FIGS. 16 and 17 illustrate an exemplary carrier 1602 that can include power distribution lines 1604 and ground lines 1606 according to some embodiments of the invention. The carrier 1602 can also include de-coupling capacitors 1608, which can be electrically connected between a power distribution line 1604 and a ground line 1606 as shown in FIGS. 16 and 17. Other electronic components (e.g., resistors) can also be included on carrier 1602. Carrier 1602, like carrier 1102, can take shapes other than circular, including without limitation oval, rectangular, square, etc.

As shown in FIGS. 16 and 17, carrier 1602 can also include a plurality of test sites 1610, each of which can include a die site 1650 where a die 804 to be tested can be located and circuitry 1620 (e.g., application circuitry) that can be used to test one or more of the dies 804. In FIGS. 16 and 17, there is a die 804 disposed in each die site 1650. Circuitry 1620 can be, for example, circuitry that functions like one or more electronic devices that a die 804 is designed to operate with in an electronics system. For example, if die 804 is a memory die, the circuitry 1620 can be processor circuitry that writes data to and reads data from the memory die. Circuitry 1620 can thus mimic operation of a processor die that the memory die (804) will operate with in an electronics system. Alternatively, circuitry 1620 can be a processor die. Indeed, circuitry 1620 can comprise one or more dies that a die 804 is designed to operate with in an electronics system.

As shown in FIG. 16, each test site 1610 can also include control inputs 1624 by which the circuitry 1620 can be controlled, and outputs 1622 from the circuitry 1620, which can be provided to a die 804. A contactor device (e.g., the probe card assembly 208 of FIG. 2, the intermediate connection device 404 of FIG. 4c, the testing substrate 500, or the probe card assembly 1402 of FIGS. 14 and 15) can be configured to contact the control inputs 1624 and thereby control the circuitry 1620, causing circuitry 1620 to generate outputs that are provided through outputs 1622 to a die 804. The contactor device (not shown) can also be configured to contact terminals 806 and thereby monitor signals generated by the die 804. A tester (e.g., like tester 214 of FIG. 2 or tester 1502 of FIG. 15) can provide the control signals to the circuitry 1620 and can receive and analyze the response signals generated by the die 804. In this way, each die 804 can be tested as part of a system that the die 804 is designed to operate in.

In some embodiments, the outputs 1622 can be configured to be selectively connectable to the dies 804 so that the dies 804 can be selectively tested with circuitry 1620 or selectively tested without circuitry 1620. The contactor device (e.g., the probe card assembly 208 of FIG. 2, the intermediate connection device 404 of FIG. 4c, the testing substrate 500, or the probe card assembly 1402 of FIGS. 14 and 15) can be configured to control whether the circuitry 1620 is activated and its outputs 1622 connected to dies 804 or whether dies 804 are tested by themselves. Alternatively, one contactor device can be configured to contact the control inputs 1624 to the circuitry 1620 and connect the outputs 1622 of the circuitry 1620 to the dies 804 and thereby test dies 804 with circuitry 1620, and a second contactor device can be configured to contact only the dies 804 and thereby test the dies 804 without circuitry 1620.

Figure 16A:
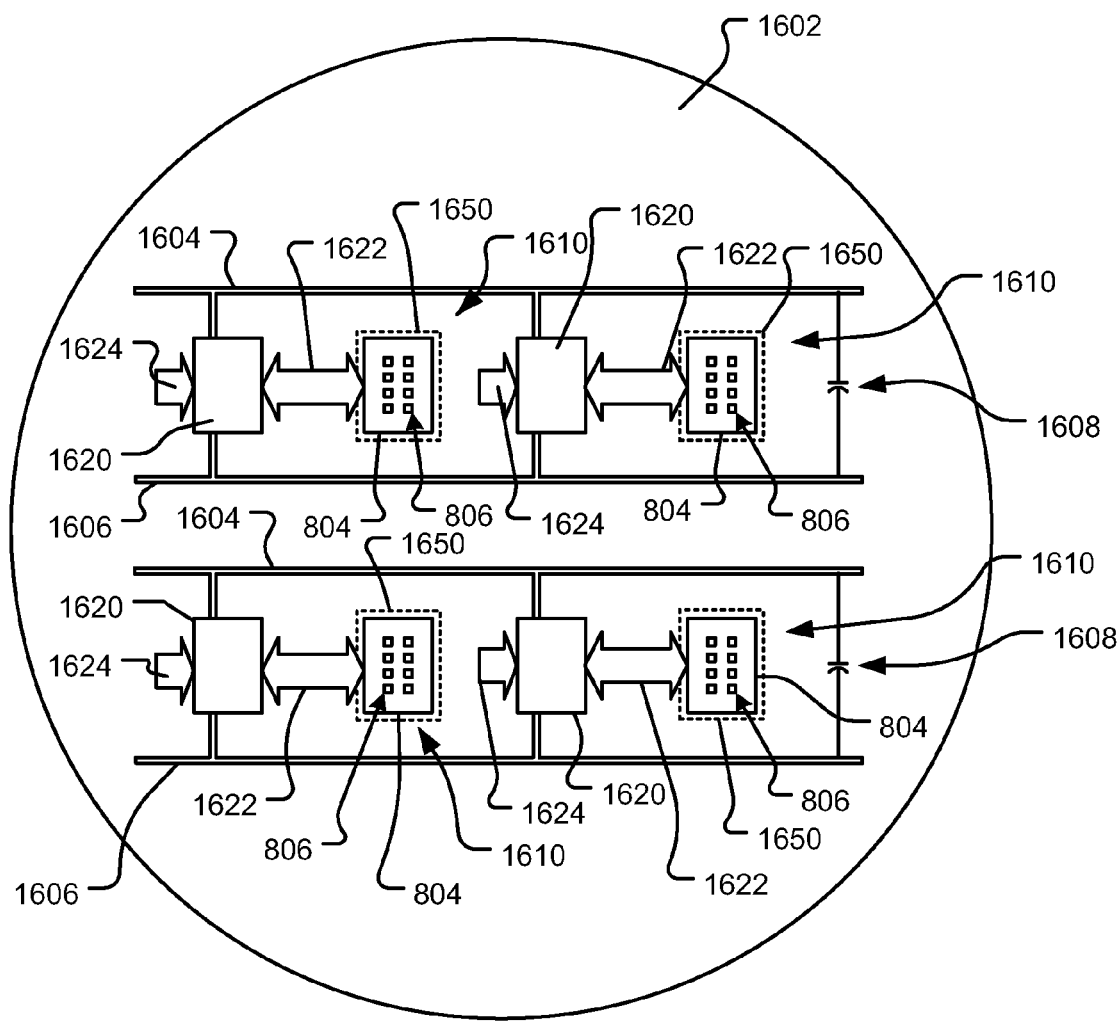
FIG. 16a illustrate a top view of an exemplary carrier with test sites comprising test circuitry for testing dies of the wafer of FIG. 8 according to some embodiments of the invention.
Figure 16B:
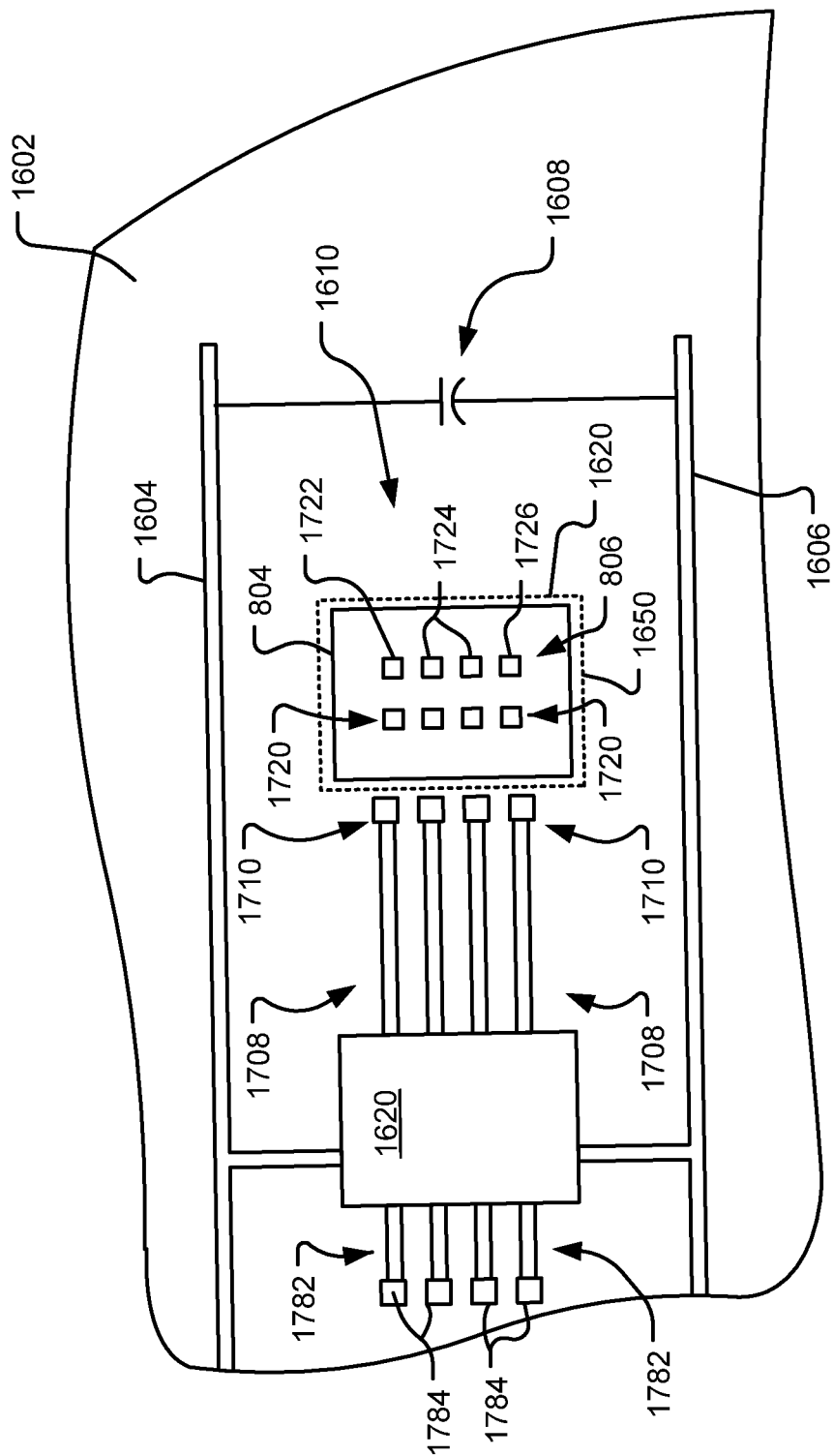
FIG. 16b illustrates an exemplary configuration of a test site of the carrier of FIG. 16 according to some embodiments of the invention.

A non-limiting, exemplary configuration of a test site 1610 is shown in FIG. 16b. As shown, control inputs 1624 can comprise electrically conductive pads 1784 and electrically conductive traces 1782 can be provided from the pads 1784 to circuitry 1620. Outputs 1622 can comprise electrically conductive traces 1708 that terminate in pads 1710, which can be located generally close to the die site 1650 as shown. In the example shown in FIG. 16b, the terminals 806 of the die 804 can be configured as follows: terminals 1720 can be input terminals through which signals can be input into the circuitry of the die 804; terminals 1724 can be output terminals through which the circuitry of the die 804 can output signals; terminal 1722 can be a power terminal through which power can be provided to the circuitry of the die 804; and terminal 1726 can be a ground terminals through which a ground connection can be provided to the circuitry of the die 804. The foregoing configuration of the terminals 806 of die 804 is exemplary only and for purposes of illustration, discussion, and example. Many other numbers and configurations of terminals 806 can be provided for a die 804.

Figure 17A:
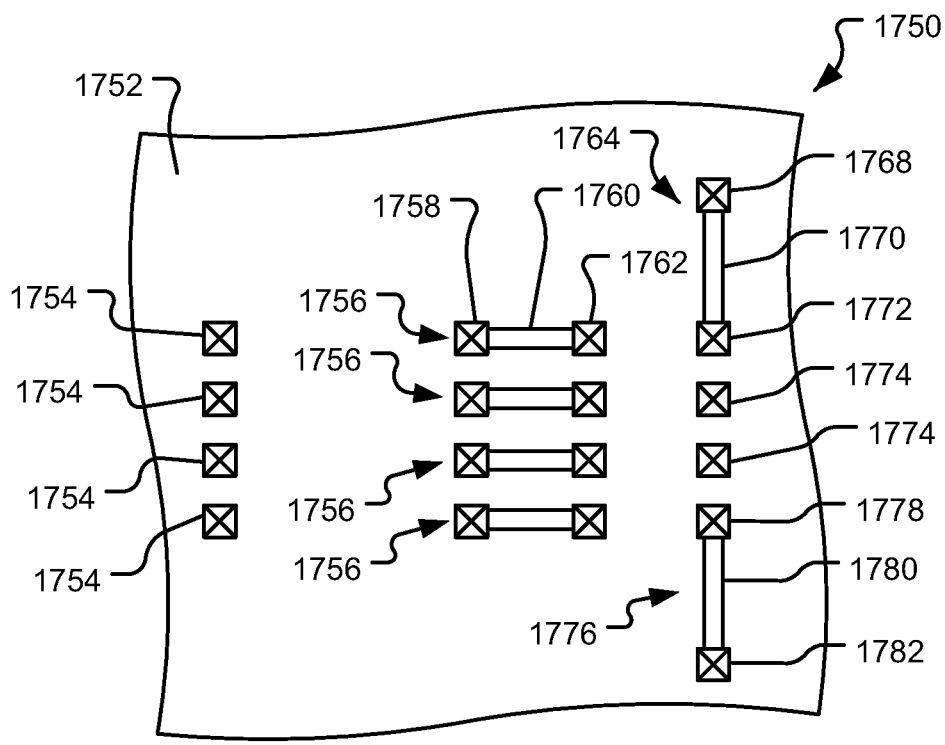
FIG. 17a illustrates a partial view of an exemplary first contactor device that can be used to contact pads and terminals of the test site 1610 shown in FIG. 16b according to some embodiments of the invention.

FIG. 17a illustrates a partial view of a portion of a contactor device 1750 (e.g., a first contactor device) with exemplary probes for contacting pads and terminals of a test site 1610 of FIGS. 16a and 16b. Additional such probes can be provided for contacting pads of all or additional ones of the test sites 1610 and all or additional ones of the terminals 806 of the dies 804 on the carrier 1602. The contactor device 1750 shown in partial view in FIG. 17a can be like the probe card assembly 208 of FIG. 2, the intermediate connection device 404 of FIG. 4c, the testing substrate 500, or the probe card assembly 1402 of FIGS. 14 and 15. For example, the substrate 1752 can be like the probe substrate 1408 of FIGS. 14 and 15. As shown in FIG. 17a, the contactor device 1750 can include a plurality of probes (e.g., a first plurality of probes) (which can be like probes 222 of FIG. 2 or probes 1410 of FIGS. 14 and 15), only a few of which are shown in FIG. 17a. Probes 1754 (e.g., a first set of the probes) can be located to contact pads 1784 of FIG. 16b, and probes 1774 (a second set of the probes) can be configured to contact output terminals 1724, which can be ones of the terminals 806 of the die 804 shown in FIG. 16b configured to output signals from the die 804.

As also shown in FIG. 17a, the contactor device 1750 can also include electrically connected pairs 1756 of probes (e.g., a third set of probes), each comprising two probes 1756, 1762 electrically connected by a trace 1760. One probe (e.g., 1756) in each probe pair 1756 can contact one of the pads 1710, and the other probe (e.g., 1762) can contact one of input terminals 1720 (which, as discussed above, can be ones of the terminals 806 of the die 804 configured to be input terminals, as shown in FIG. 16b). Each probe pair 1756 can thus electrically connect one of the pads 1710—and thus one of the outputs from the circuitry 1620—to an input terminal 1720 of the die 804. As shown, the contactor device 1750 can also include probe pairs 1764 and 1776. Probe pair 1764 can include two probes 1768 and 1772 electrically connected by a trace 1770, and probe pair 1776 can similarly include two probes 1778 and 1782 electrically connected by a trace 1780. Probe 1768 can be brought into contact with power line 1604, and probe 1772 can be brought into contact with power input terminal 1722, which can be one of the terminals 806 of the die 804 configured to receive power for the die 804. An electrical connection from power line 1604 to power input terminal 1722 can thus be provided. Similarly, probe 1782 can be brought into contact with ground line 1606, and probe 1778 can be brought into contact with ground input terminal 1726, which can be one of the terminals 806 of the die 804 configured to receive a ground connection. An electrical connection from ground line 1606 to ground input terminal 1726 can thus be provided.

If contactor device 1750 is configured like probe card assembly 1402 of FIGS. 14 and 15 and connected to a tester like tester 1502 through communications channels like communications channels 1504 of FIG. 15, the tester 1502 can provide control signals (e.g., which can be termed "test signals") through probes 1754 to pads 1784 and traces 1782 to circuitry 1620. The tester 1502 can thus control the circuitry 1620. Output signals (e.g., application circuit output signals) generated by the circuitry 1620 can be provided through traces 1708, pads 1710, and probe pairs 1756 to input terminals 1720 of the die 804. Response signals (e.g., die output signals) generated by the die 804 in response to the signals output by the circuitry 1620 can be sensed by the probes 1774 in contact with output terminals 1724 and provided through the contactor device 1750 and communications channels 1504 to the tester 1502. The tester 1502 can then analyze the response signals to determine whether the response signals are as expected and thus whether the die 804 passes the testing. The tester 1502 can thus test die 804 by causing the circuitry 1620 to generate input signals for die 804 that drive the die 804 and then monitoring the response of the die 804 to the signals from circuitry 1620.

Figure 17B:
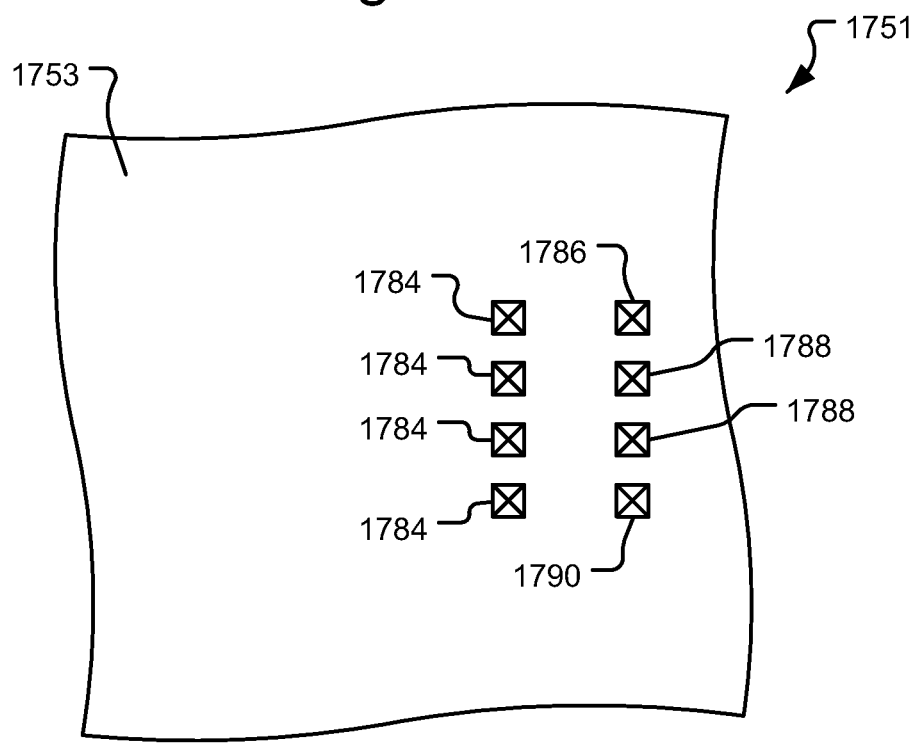
FIG. 17b illustrates a partial view of an exemplary second contactor device that can be used to contact terminals of the die shown in FIG. 16b according to some embodiments of the invention.

FIG. 17b shows a partial view of another contactor device 1751 (e.g., a second contactor device), which can be generally similar to contactor device 1750 except for the configuration of probes on substrate 1753 (which can be like substrate 1752). As shown, contact device 1751 can include probes 1784 configured to contact the input terminals 1720 of die 804, probes 1788 configured to contact the output terminals 1724 of die 804, and power and ground probes 1786, 1790 configured to contact power and ground terminals 1722, 1726 of die 804. If contactor device 1751 is configured like probe card assembly 1402 of FIGS. 14 and 15 and connected to a tester like tester 1502 through communications channels like communications channels 1504 of FIG. 15, the tester 1502 can provide test signals through probes 1784 directly to input terminals 1720 of the die 804. Response signals generated by the die 804 in response to the test signals can be sensed by the probes 1788 and provided through the contactor device 1751 and communications channels 1504 to the tester 1502. The tester 1502 can then analyze the response signals to determine whether the response signals are as expected and thus whether the die 804 passes the testing. Power and ground connections can be provided to the die 804 from tester 1502 through probes 1786 and 1790 to power and ground terminals 1722 and 1726 of the die 804. The tester 1502 can thus test die 804 by providing signals (e.g., which can be termed test signals) directly to the die 804 and monitoring the response of the die 804 to the signals. Contactor device 1751 can include additional probes for contacting all of the dies 804 on carrier 1602.

Utilizing the carrier 1602 of FIGS. 16 and 17, dies 804 can be tested in conjunction with circuitry 1620 simply by utilizing a contactor device 1750 configured as shown in FIG. 17a. Alternatively, dies 804 can be tested without circuitry 1620 simply by utilizing a contactor device 1751 configured as shown in FIG. 17b. Indeed, multiple tests can be run on the dies 804 utilizing a carrier like carrier 1602. For example, initial tests testing the basic functionality of dies 804 by themselves can be run by utilizing the probes 1784, 1786, 1788, 1790 of the contactor device 1751 (e.g., by bringing the contactor device 1751 into contact with the terminals 1720, 1722, 1724, 1726 of dies 804 and providing test signals from a tester, like tester 1502, to the dies 804 and monitoring and analyzing response signals generated by the dies 804). Thereafter, additional testing can be performed on the dies 804 utilizing circuitry 1620 (e.g., by bringing the contactor device 1750 into contact with the pads 1724, pads 1710, power line 1604, ground line 1606, and terminals 1720, 1722, 1724, 1726 of dies 804 and testing the dies 804 with the use of circuitry 1620 as discussed above).

Alternatively, initial testing can be performed with contactor device 1750 and further testing with contactor device 1751. Moreover, the configurations of power lines 1604, ground lines 1606, pads 1724, 1710, traces 1722, 1708, the number of terminals 806 and the signals assigned to each terminal 806 and the corresponding number and assignment of signals to probes 1754, 1758, 1762, 1768, 1772, 1774, 1778, 1782 can be other than shown in the examples illustrated in FIGS. 16a-17b. Also, the probes 1754, 1758, 1762, 1768, 1772, 1774, 1778, 1782 can be like probes 222 of FIG. 2 probes 406 of FIG. 4c, probes 502 of FIG. 5b, or probes 1410 of FIGS. 14 and 15. In addition, contactor device 1750 can be modified to provide power and ground to dies 804 in the same way that contactor device 1751 provides power and ground to dies 804—through probes like probes 1786, 1790. Similarly, contactor device 1751 can be modified to provide power and ground to dies 804 in the same way that contactor device 1750 provides power and ground to dies 804—be creating a connection from power line 1602 and ground line 1606 to power and ground terminals of the dies 804.

The configuration of carrier 1602 illustrated in FIGS. 16*a* and 16*b* and the configuration of contactor devices 1750 and 1751 illustrated in FIGS. 17*a* and 17*b* are exemplary only and many variations are possible. For example, dies 804 can be configured to receive inputs from a tester (e.g., tester 1502) and provide outputs to application circuitry 1620, which can then be provided to the tester for evaluation. Thus, for example, outputs 1622 can comprise outputs from die 804 to application circuitry 1620, and control inputs 1624 can be replaced with outputs that can be contacted by probes of a contactor device that is in turn connected to the tester. As yet another exemplary modification, application circuitry 1620 can be connectable to more than one die 804. As yet another example, one die 804 can be connectable to multiple circuitries, each generally like application circuitry 1620 but each configured to perform different functions and/or simulate different circuits the dies 804 are designed to be used with in a final application.

Figure 18:
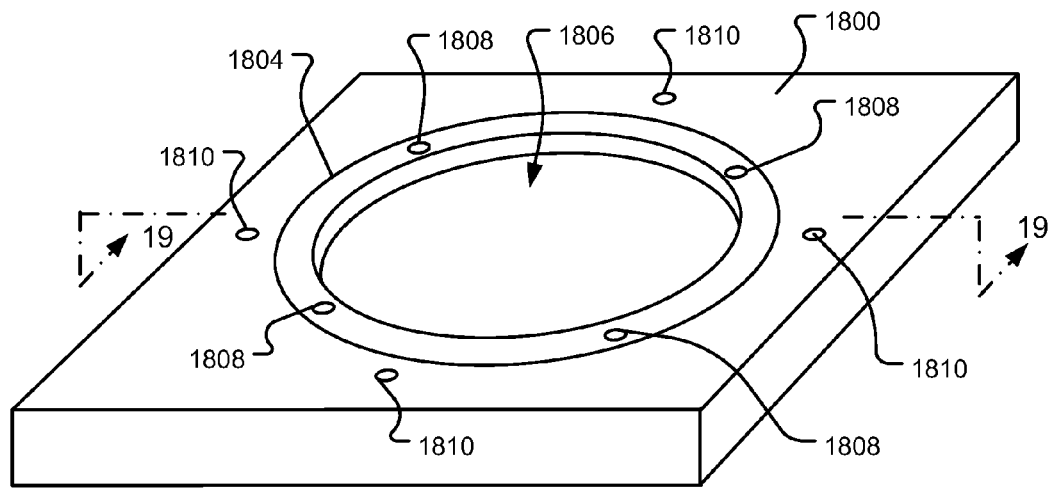
FIGS. 18 and 19 illustrate an exemplary base configured to receive a carrier substrate according to some embodiments of the invention.
Figure 19:
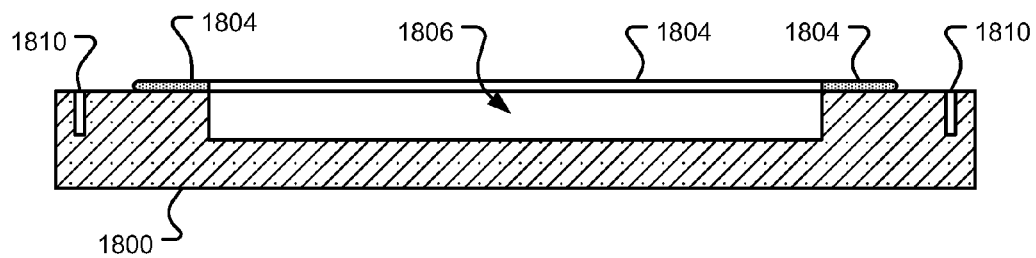

FIGS. 18-21 illustrate an exemplary carrier apparatus according to some embodiments of the invention. As shown in FIGS. 18 and 19, the carrier apparatus can include a base 1800, which can include a cavity 1806 for receiving a carrier substrate 2002 (see FIG. 20). The base can include a sealing gasket 1804 around the cavity 1806. The base can also include threaded holes 1808, 1810. Cavity 1806 can take shapes other than circular, including without limitation oval, rectangular, square, etc. Alternatively, the carrier 2002 can be a surface of the base 1800 (e.g., a surface of the cavity 1806).

Figure 20:
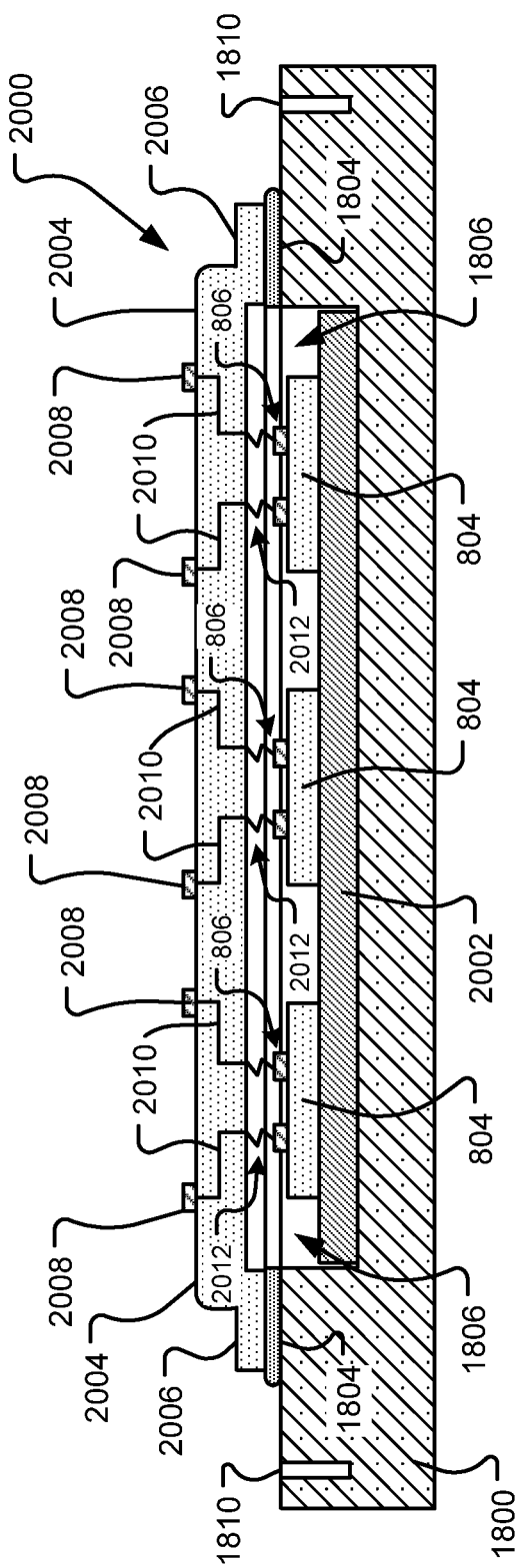
FIG. 20 illustrates the base of FIGS. 18 and 19 with a carrier substrate and an intermediate connection device according to some embodiments of the invention.

As shown in FIG. 20, dies 804 can be disposed on a carrier substrate 2002, which can be like any of carrier substrate 300, testing substrate 400, testing substrate 500, carrier 1102, or carrier 1602. Dies 804 can be placed on carrier substrate 2002 in any manner described above with respect to the foregoing carrier substrates, testing substrates, or carriers (300, 400, 500, 1102, 1602). As also shown in FIG. 20, an intermediate connection device 2000 (e.g., a first interface device) can be attached to the base 1800. For example, the intermediate connection device 2000 can be bolted, screwed, clamped, or otherwise attached to the base 1800. In one non-limiting example, bolts (not shown) can pass through holes (not shown) in a flange 2006 of the intermediate connection device 2000 and thread into threaded holes 1808 in the base 1800 (see FIG. 18). As shown in FIG. 20, the flange 2006 of the intermediate connection device 2000 can thus be tightened against the gasket 1804 and thereby form a hermetically sealed mechanical engagement with the base 1800. The intermediate connection device 2000 can be made of a material or material that is generally solid (e.g., metal, printed circuit board material, ceramic, plastic, etc.), and the base 1800 can be generally similar so that while the intermediate connection device 2000 is attached to the base 1800, the base 1800 and the intermediate connection device 2000 form a hermetically sealed enclosure space that includes the cavity 1806 in which the carrier substrate 2002 with dies 804 is located. The cavity 1806 can thus provide a hermetically sealed, clean space for dies 804. As is known, semiconductor dies, such as dies 804, are typically manufactured in a clean room environment. Dies 804, while still in a clean room environment, can be placed in cavity 1806 and intermediate connection device 2000 attached to the base 1800 as described above. Because the intermediate connection device 2000 and the base 1800 can form a sealed enclosure that includes the cavity 1806 as described above, the base 1800 and intermediate connection device 2000 can then be removed from the clean room environment without exposing the dies 804 to contaminants. The cavity 1806 can thus provide a clean room space for the dies 804 as the dies 804 are tested, transported, etc.

As shown in FIG. 20, the intermediate connection device 2000 (which can be a non-limiting example of the intermediate connection device 404 of FIG. 6) can include an interface portion 2004 that provides electrically conductive paths 2010 (e.g., electrically conductive traces and/or vias), which can be electrical connections, between electrically conductive terminals 2008 (e.g., a first electrical interface) on an outer surface of the intermediate connection device 2000 and probes 2012 disposed to contact terminals 806 of the dies 804 as shown in FIG. 20. The interface portion 2004 of the intermediate connection device 2000 can thus provide an electrical interface, in the form of terminals 2008, to die terminals 806.

The probes 1012 can be configured to be pressed against the die terminals 806, and the force of the probes 2012 against the die terminals 806 can hold the dies in place on the carrier substrate 2002. Alternatively or additionally, means can be provided to hold the dies 804 in place on the carrier substrate, including any of the means discussed above (e.g., a vacuum, electrostatic charges, an adhesive, a sticky or tacky film (e.g., like 1204 of FIG. 12)). Probes 2012 can be like any of the probes or probe elements discussed herein, including without limitation probes 1410 of FIGS. 14 and 15.

Figure 21:
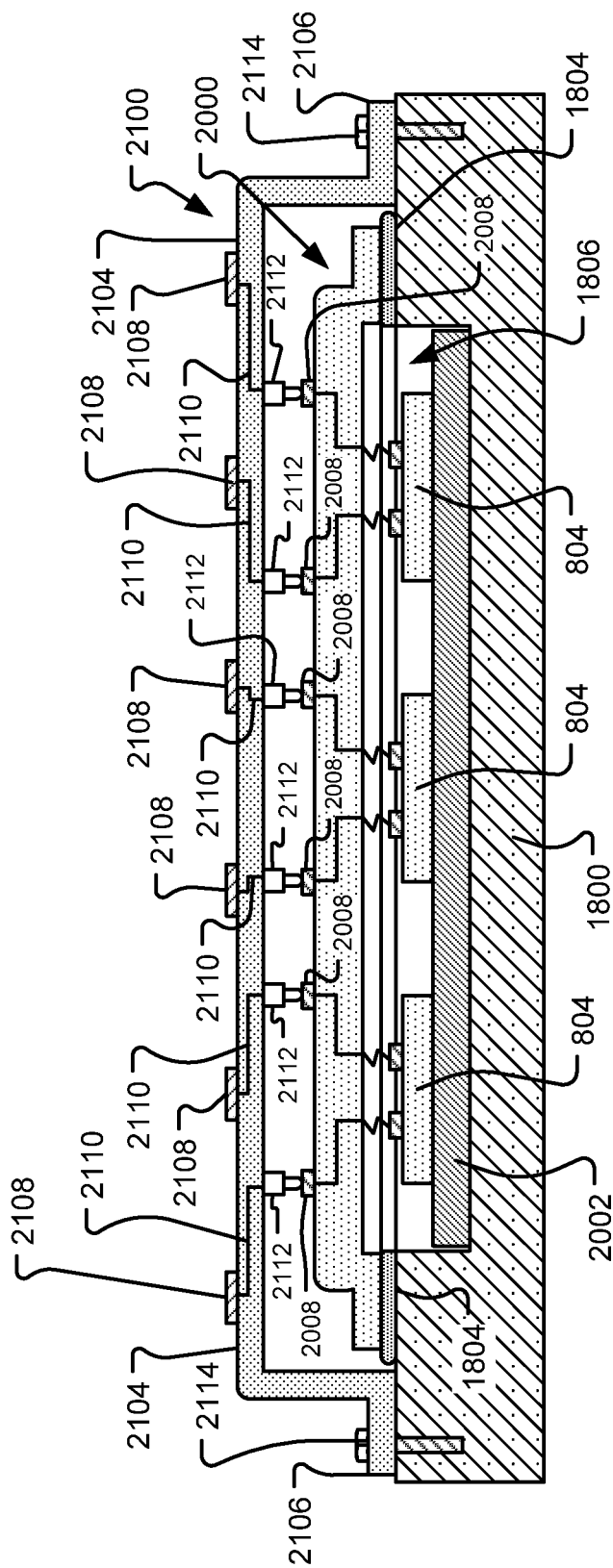
FIG. 21 illustrates the base, carrier substrate, and intermediate connection device of FIG. 20 with a tester interface device attached to the base according to some embodiments of the invention.

As shown in FIG. 21, a tester interface device 2100 (e.g., a second interface device) can also be attached to the base 1800. For example, the tester interface device 2100 can be bolted, screwed, clamped, or otherwise attached to the base 1800. In one non-limiting example, bolts 2114 can pass through holes (not shown) in a flange 2106 of the tester interface device 2100 and thread into threaded holes 1810 in the base 1800 (see FIG. 18).

As shown in FIG. 21, the tester interface device 2100 (which can be a non-limiting example of the top 606 of FIG. 6) can include an interface portion 2104 that provides electrically conductive paths 2110 (e.g., electrically conductive traces and/or vias) between electrically conductive terminals 2108 (e.g., a second electrical interface) on an outer surface of the tester interface device 2100 and electrical connectors 2112 (e.g., first electrical connectors) disposed to contact terminals 2008 of the intermediate connection device 2000 as shown in FIG. 21. Electrical connectors 2112 can be any suitable mechanism for making electrical connections with the terminals 2008 of the intermediate connection device 2000. Non-limiting examples of suitable electrical connectors 2112 include pogo pin connectors, zero-insertion-force electrical connectors, resilient spring contacts, etc. The interface portion 2104 of the tester interface device 2100 can thus provide an electrical interface, in the form of terminals 2108, to a tester (e.g., like tester 214 of FIG. 2 or tester 1502 of FIG. 15).

The apparatus shown in FIG. 21 can thus provide electrical connections between electrically conductive terminals 2108 on an outside surface of the tester interface device 2100 and probes 2012 in contact with terminals 806 of the dies (see also FIG. 20). A tester (e.g., tester 214 of FIG. 2 or tester 1502 of FIG. 15) can be connected to the terminals 2108 on the outside surface of the tester interface device 2100 and thereby form a plurality of electrical connections to and from the dies 804. The tester can then generate test signals that are input into the dies 804, and the tester can monitor (e.g., sense through ones of the probes 2012) response signals generated by the dies 804 in response to the test signals. The tester can then analyze the response signals to determine whether the response signals generated by a particular die 804 are as expected and therefore whether the die passes the testing. The number, locations, and signal assignments of the terminals 2108 on the outer surface of the tester interface device 2100 can be configured to interface with a particular tester. The tester interface device 2100 can be removed and replaced with a different tester interface device, which can be similar to tester interface device 2100 except that the number, locations, and/or signal assignments of the terminals 2108 can be different and configured to interface with a different tester.

The apparatus shown in FIG. 21 can be used in many different test systems, and terminals 2108 can be configured to interface with many different testers and/or intermediate devices between such testers. For example, the apparatus shown in FIG. 21 can be placed on a chuck, like chuck 204, in a probing system 200, like probing system 200. Terminals 2108 can be brought into contact with probes 222 of the probe card assembly 208.

Figure 22:
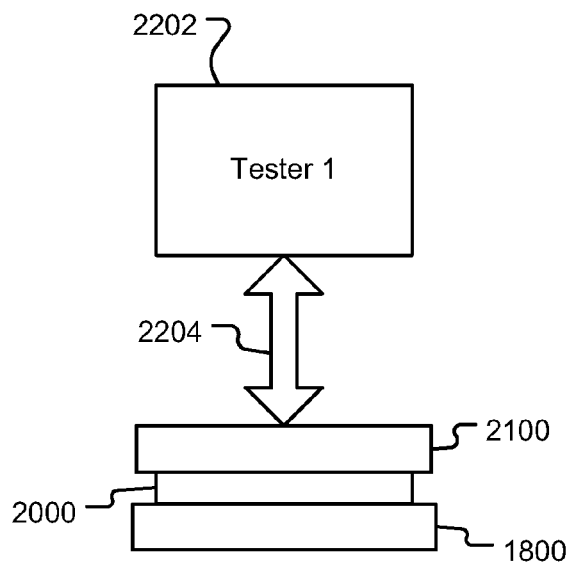
FIGS. 22-24 illustrate the base and intermediate connection device of FIG. 20 with different tester interface devices configured to connect with communication channels from different testers according to some embodiments of the invention.
Figure 23:
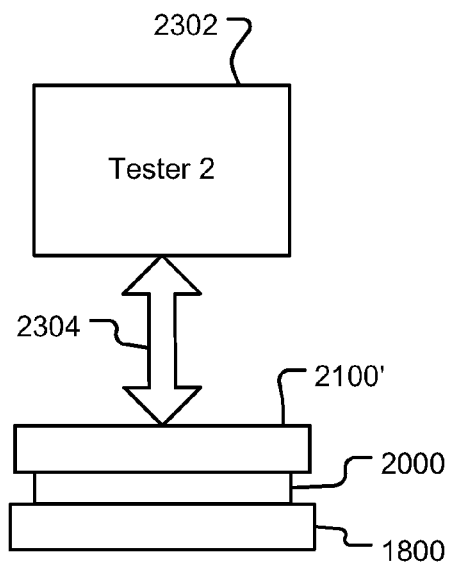
Figure 24:
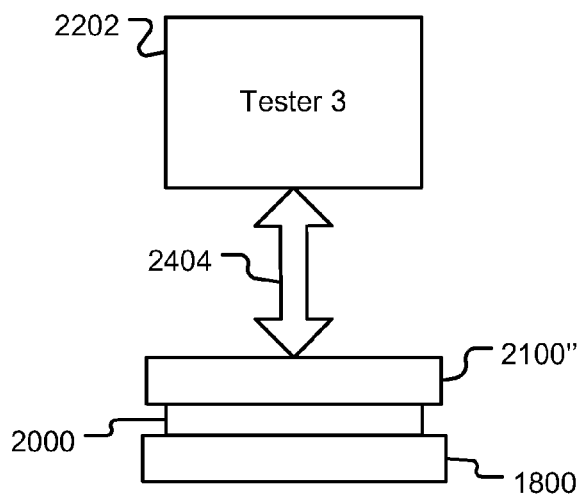

FIGS. 22-24 illustrate a non-limiting example in which intermediate connection device 2000 is attached to base 1800 (e.g., as shown in FIG. 20). In FIG. 22, a first tester interface device 2100 can be attached to the base 1800 (as described above), and the first tester interface device 2100 (e.g., a first electrical interface) can be configured to interface with communications channels 2204 from a first tester—tester 1 (2202) (e.g., a first source of test signals), which can be configured to run certain tests (e.g., a first set of tests). A shown in FIG. 23, the first tester interface device 2100 can be removed and replaced with a second tester interface device 2100' (e.g., a second electrical interface), which can be configured to interface with communications channels 2304 from a second tester—tester 2 (2302) (e.g., a second source of test signals). Tester 2 (2302) can be configured to run certain tests (e.g., a second set of tests) that can be different than the tests run by the first tester 2202. As shown in FIG. 24, the second tester interface device 2100' can be removed and replaced with a third tester interface device 2100" (e.g., a third electrical interface), which can be configured to interface with communications channels 2404 from a third tester—tester 3 (2402) (e.g., a third source of test signals). Tester 3 (2402) can be configured to run certain tests (e.g., a third set of tests) that can be different than the tests run by the first tester 2202 and the second tester 2302. Each of the first, second, and third sets of tests can generally comprise providing test signals to the dies 804, sensing response signals generated by the dies 804, and analyzing the response signals to determine if the response signals are as expected and thus whether the dies passes the testing.

Each tester 2202, 2302, 2402 in FIGS. 22, 23, and 24 can be configured like and function generally like tester 214 of FIG. 2 or tester 1502 of FIG. 15, yet each tester 2202, 2302, and 2402 can be different one from another. For example, each tester 2202, 2302, 2402 can be configured to output different numbers, types, sequences, etc. of test signals to dies 804 (located within a cavity in base 1800 (see FIG. 20)). Each tester 2202, 2302, 2402 can also be configured to monitor different outputs from the dies 804. Although each set of communications channels 2204, 2304, 2404 can be generally similar to communications channels 1502 of FIG. 15, each set of communications channels 2204, 2304, 2404 can be different one from another. For example each set of communications channels 2204, 2304, 2404 can be configured for the particular interface or configuration of its respective tester 2202, 2302, 2402, and each tester interface device 2100, 2100', 2100" can be configured to interface with one of the sets of communications channels 2204, 2304, 2404 as shown in FIGS. 22-24. The number, locations, signal assignments, etc. of the terminals 2108 (see FIG. 21) on each tester interface device 2100, 2100', 2100" can thus be different and configured specifically to interface with one of the sets of communications channels 2204, 2304, 2404. The electrical connectors 2112 (see FIG. 21), in contrast, can be positioned generally in the same locations in each tester interface device 2100, 2100', 2100" so that each tester interface device 2100, 2100', 2100" can connect to the same intermediate connection device 2000. Paths 2100 in each tester interface device 2100, 2100', 2100" can be custom configured in each tester interface device 2100, 2100', 2100" so that each terminal 2108 on the outside of a tester interface device (e.g., 2100, 2100', 2100") configured to receive from or send to the tester a particular signal is connected to the probe 2012 (see FIG. 20) in contact with the die terminal 806 configured to receive as input or to output that particular signal. In some cases, a particular tester may not generate all possible input signals to a die 804 and/or monitor all possible output signals from a die 804. In such cases, the number of connectors 2112 can vary among different tester interface devices (e.g., 2100, 2100', 2100").

The configurations shown in FIG. 18-24 are exemplary only and many variations are possible. For example, both an intermediate connection device 2000 and a tester interface device 2100 need not be included in some embodiments. In such embodiments, for example, the tester interface device 2100 can be dispensed with and the terminals 2008 of the intermediate connection device 2000 can interface directly with a tester. In such a case, different intermediate connection devices 2000 can be provided to interface with different testers.

Referring again to FIG. 7, once singulated dies 804 are placed on a carrier at 708, the dies can be tested at 710. Testing at 710 can include one or a plurality of different tests. The number and types of tests performed on the dies 804 can depend on several factors, including the type of circuitry integrated into the dies 804, the reliability requirements of the dies 804, etc. Testing at 710 can include traditional wafer sort testing, burn-in, and full functionality testing. Burn-in, which as is known involves heating the dies 804 to accelerate the appearance of latent faults in ones of the dies, can involve merely heating the dies 804 for an extended period of time. Alternatively, burn-in can be static burn-in, which typically involves heating the dies 804 for a period of time while applying power to the dies 804. Burn-in can also be dynamic burn-in, which typically involves heating the dies 804 for a period of time while operating or exercising the dies 804. The dies 804 can—but need not—be tested during burn-in. Testing at 710 can also include testing at the intended operating frequency of the dies 804, which can involve high frequency testing. If testing at 710 includes performing multiple tests on the dies 804, after each such test, dies 804 identified as bad can be discarded and replaced with new dies 804, and the test can be repeated.

The testing at 710 can include testing in which test signals are supplied by a tester (e.g., like tester 214 of FIG. 2 or tester 1502 of FIG. 15). Alternatively or additionally, testing at 710 can include testing in which a tester activates built in, self test circuitry in each die 804 and then monitors and/or analyzes the results. As illustrated in FIGS. 22-24 and discussed above, testing at 710 can involve testing the dies 804 with different testers (e.g., 2202, 2302, 2402). For example, tester 1 (2202) in FIG. 22 can be configured to perform wafer sort type testing on the dies 804 in base 1800; tester 2 (2302) of FIG. 23 can be configured to burn in the dies 804 while exercising the dies 804 (which may or may not include actual monitoring of outputs of the dies 804 to determine whether dies 804 function or do not function properly); and tester 3 (2402) of FIG. 24 can be configured to perform final testing of the dies 804. Note that the term "testing" or any form of the word "testing,"

as used herein, includes activities that are part of an overall process for identifying defects or faults in dies 804 regardless of whether a particular activity itself involves monitoring outputs of the dies 804. Burn-in that does not include monitoring outputs of the dies 804 is an example of such an activity and can therefore be included within the meaning of "testing," as used herein. Of course, burn-in that includes monitoring the outputs of the dies 804 is also a form of "testing."

In any of the configuration shown in FIGS. 22-24, one or more intermediate devices can be interposed between the channels 2204, 2304, 2404 and the tester interface 2100, 2100', 2100". For example, a probe card assembly, like probe card assembly 208 of FIG. 2 or probe card assembly of FIGS. 14 and 15) can be disposed between one or more of channels 2204, 2304, 2404 and tester interface 2100, 2100', 2100". Thus, terminals 2108 of FIG. 21 can be configured and disposed to contact probes 1410 of the probe card assembly 1402 of FIGS. 14 and 15, whose connectors 1506 can be connected to one or more of the channels 2204, 2304, 2404.

Figure 25:
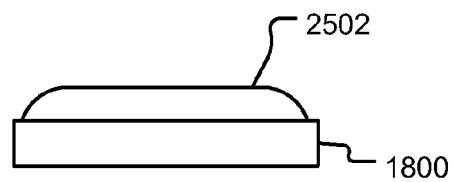
FIG. 25 illustrates the base of FIGS. 18 and 19 with a cover attached according to some embodiments of the invention.

Referring again to FIG. 7, after full testing at 710, the dies 804 that passed the testing at 710 can undergo further processing at 712. For example, if the dies 804 are bare, unpackaged dies, the dies 804 can be packaged, although in some cases, bare, unpackaged dies can be used as such in final applications and therefore need not be packaged. The further processing at 712 can include shipping or transporting the dies 804. In some embodiments, the carrier or testing substrate on which the dies 804 were tested can function as a shipping container. An example is shown in FIG. 25. After testing dies 804 on carrier substrate 2002 disposed in the cavity 1806 of the base 1800 (see FIGS. 18-20), the tester interface device 2100 and intermediate connection device 2000 (see FIGS. 21 and 22) can be removed and can be replaced with a cover 2502 (e.g., a shipping cover) as shown in FIG. 25. The cover 2502 can be attached to the base 1800 in any manner described above for attaching either the tester interface device 2100 or the intermediate connection device 2000 to the base 1800. The cover 2502 and base 1800 can then function as a shipping container for the dies 804.

Storage means (e.g., a digital memory), like storage means 412 of FIG. 4c, can be provided with the carriers 1102, 1602 of FIGS. 11 and 16 or with the carrier substrate 2002 or any other element of the apparatus shown in FIG. 21. Such storage means can store information about the dies 804. Such information can include manufacturing and test information regarding the dies 804. Results, including intermediate results, of testing of the dies 804 can also be stored in such storage means.

Moreover, the carriers 1102, 1602 of FIGS. 11 and 16 or the carrier substrate 2002 or any other element of the apparatus shown in FIG. 21 can also include environmental control means, such as environmental control means 414 of FIG. 4c. Such environmental control means can include heaters and/or mechanisms for cooling the dies 804 and can be activated to heat or cool the dies 804 during testing in order to test the dies 804 at specified temperatures and/or maintain the dies 804 within a particular or specified temperature range during testing.

The carriers 1102, 1602 of FIGS. 11 and 16 or the carrier substrate 2002 or any other element of the apparatus shown in FIG. 21 can also include compression stops like the compression stops 410 of FIG. 4c, including but not limited to the configuration of compression stops 410 shown in FIGS. 4d and 4e. In addition, any of carriers 1102, 1602 of FIGS. 11 and 16 or carrier substrate 2002 can be configured like testing substrate 500 of FIGS. 5a-5c with probes (like probes 502 of FIGS. 5a-5c). Dies 804 can be located on such probes such that the probes contact terminals 806 of the dies 804. Dies 804 can thus be disposed on a carrier, carrier substrate, etc. with their active sides down, as generally shown in FIGS. 5b and 5c.

Although specific embodiments and applications of the invention have been described in this specification, there is no intention that the invention be limited these exemplary embodiments and applications or to the manner in which the exemplary embodiments and applications operate or are described herein.

We claim:
1. An apparatus comprising:
 a die carrier comprising:
  a carrier;
  die sites on the carrier, each die site comprising an area on the carrier where a singulated die can be placed;
  application circuitry disposed on the carrier and configured to generate data signals for input into a die disposed at one of the die sites;
  electrical connections from the application circuitry, wherein the electrical connections terminate immediately next to the one of the die sites but are spaced sufficiently away from all die sites on the carrier that the electrical connections do not physically connect to any die disposed at any die site on the carrier; and
  electrical inputs configured to receive control signals for input into the application circuitry; and
 a contactor device that is structurally distinct from the die carrier, the contactor device comprising:
  a substrate; and
  a first set of probe pairs disposed on the substrate, wherein each said probe pair comprises a first electrically conductive probe disposed to contact, without being attached to, one of the electrical connections of the die carrier and a second electrically conductive probe electrically connected to the first probe and disposed to contact, without being attached to, an input terminal of the die disposed at the one of the die sites.

2. The apparatus of claim 1, wherein the electrical inputs comprise electrically conductive elements configured to be physically contacted by probes of the contactor device.

3. The apparatus of claim 1, wherein the data signals generated by the application circuitry are test signals for testing the die disposed at the one of the die sites.

4. The apparatus of claim 3, wherein the test signals generated by the application circuitry are output through ones of the electrical connections.

5. The apparatus of claim 1, wherein the application circuitry is configured to function as an electronic device the die disposed at the one of the die sites is designed to operate with.

6. The apparatus of claim 1, wherein the application circuitry comprises an electronic device the die disposed at the one of the die sites is designed to operate with.

7. The apparatus of claim 1, wherein the application circuitry is configured to receive as inputs data through ones of the electrical connections.

8. The apparatus of claim 1, wherein the application circuitry comprises a processor circuit.

9. The apparatus of claim 1 further comprising holding means for holding dies on the carrier in the die sites.

10. The apparatus of claim 9, wherein the holding means comprises an adhesive.

11. The apparatus of claim 9, wherein the holding means holds the dies on the carrier in the die sites with a vacuum.

12. The apparatus of claim 9, wherein the holding means holds the dies on the carrier in the die sites with an electrostatic charge.

13. The apparatus of claim 1 further comprising alignment marks by which dies can by aligned on the die sites.

14. The apparatus of claim 1, wherein:
the die carrier further comprises an electrical connection to a source of power; and
the contactor device further comprises a first probe pair disposed on the substrate, wherein the first probe pair comprises an electrically conductive probe disposed to contact, without being attached to, the electrical connection to the source of power, and the first probe pair further comprises another electrically conductive probe disposed to contact, without being attached to, a power terminal of the die disposed at the one of the die sites, wherein the probes of the first probe pair are physically spaced apart but are electrically connected on the contactor device to each other.

15. The apparatus of claim 14, wherein:
the electrical connection to the source of power and the power terminal of the die disposed at the one of the die sites are not electrically connected on the die carrier; and
the first probe pair electrically connects the electrical connections source of power to the power terminal while the probes of the first probe pair are in contact with the electrical connection to the source of power and the power terminal.

16. The apparatus of claim 14, wherein:
the die carrier further comprises an electrical connection to ground; and
the contactor device further comprises a second probe pair disposed on the substrate, wherein the second probe pair comprises an electrically conductive probe disposed to contact, without being attached to, the electrical connection to ground, and the second probe pair further comprises another electrically conductive probe disposed to contact, without being attached to, a ground terminal of the die disposed at the one of the die sites, wherein the probes of the second probe pair are physically spaced apart but are electrically connected on the contactor device to each other.

17. The apparatus of claim 16, wherein the contactor device further comprises a first set of electrically conductive probes disposed on the substrate to contact, without being attached to, ones of the electrical inputs to the application circuitry on the carrier.

18. The apparatus of claim 17, wherein the contactor device further comprises a second set of electrically conductive probes disposed on the substrate to contact, without being attached to, output terminals of the die disposed at the one of the die sites.

19. The apparatus of claim 1, wherein:
none of the electrical connections are electrically connected on the die carrier to any input terminal of the die disposed at the one of the die sites; and
the first probe pairs electrically connect ones of the electrical connections on the die carrier to ones of the input terminals of the die.

* * * * *